United States Patent
Usami

(10) Patent No.: US 9,559,175 B2
(45) Date of Patent: Jan. 31, 2017

(54) SEMICONDUCTOR DEVICE

(71) Applicant: Renesas Electronics Corporation, Kanagawa (JP)

(72) Inventor: Tatsuya Usami, Hitachinaka (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/714,958

(22) Filed: May 18, 2015

(65) Prior Publication Data
US 2015/0372102 A1  Dec. 24, 2015

(30) Foreign Application Priority Data
Jun. 19, 2014 (JP) .................................. 2014-126211

(51) Int. Cl.
  *H01L 29/66* (2006.01)
  *H01L 29/417* (2006.01)
  *H01L 29/78* (2006.01)

(52) U.S. Cl.
  CPC ... *H01L 29/41775* (2013.01); *H01L 29/41783* (2013.01); *H01L 29/6656* (2013.01); *H01L 29/6659* (2013.01); *H01L 29/66628* (2013.01); *H01L 29/66636* (2013.01); *H01L 29/7833* (2013.01); *H01L 29/7834* (2013.01); *H01L 29/665* (2013.01)

(58) Field of Classification Search
  CPC ............................... G11C 5/025; G11C 11/404
  USPC ........................................................ 257/327
  See application file for complete search history.

(56) References Cited

U.S. PATENT DOCUMENTS

| | | | |
|---|---|---|---|
| 2012/0037962 A1* | 2/2012 | Breyta | H01L 21/31144 257/288 |
| 2013/0049132 A1* | 2/2013 | Doris | H01L 21/7682 257/383 |
| 2013/0230952 A1* | 9/2013 | Wang | H01L 21/823814 438/199 |
| 2013/0248950 A1* | 9/2013 | Kang | H01L 29/78 257/288 |
| 2014/0138779 A1* | 5/2014 | Xie | H01L 29/66545 257/401 |
| 2014/0246724 A1* | 9/2014 | Jang | G11C 5/025 257/368 |
| 2014/0264479 A1* | 9/2014 | Cai | H01L 29/401 257/288 |

OTHER PUBLICATIONS

C.H. Ko et al., "A Novel CVD-SiBCN Low-K Spacer Technology for High-Speed Applications", Symposium on VLSI Technology Digest of Technical Papers, 2008, pp. 108-109.
Daewoong Kang et al., "The Air Spacer Technology for Improving the Cell Distribution in 1 Giga Bit NAND Flash Memory", Non-Volatile Semiconductor Memory Workshop, IEEE NVSMW, 2006, pp. 36-37.

* cited by examiner

*Primary Examiner* — Trung Q Dang
*Assistant Examiner* — Patricia Reddington
(74) *Attorney, Agent, or Firm* — Sughrue Mion, PLLC

(57) ABSTRACT

The parasitic capacitance formed by a gate electrode, a contact, and a side wall is reduced.
The gate electrode and the side wall are covered by an insulating layer. The contact passes through the insulating layer and is connected to a diffusion layer. Then, an air gap is located between the side wall and the contact. The air gap faces the contact at the side face on the contact side via the insulating layer.

11 Claims, 33 Drawing Sheets

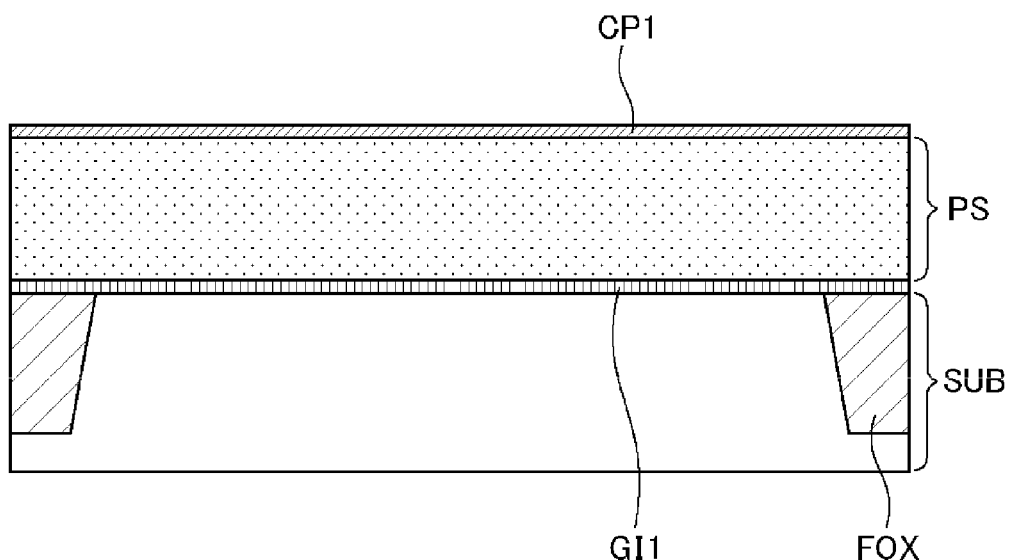
FIG. 4
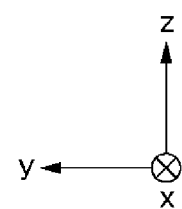

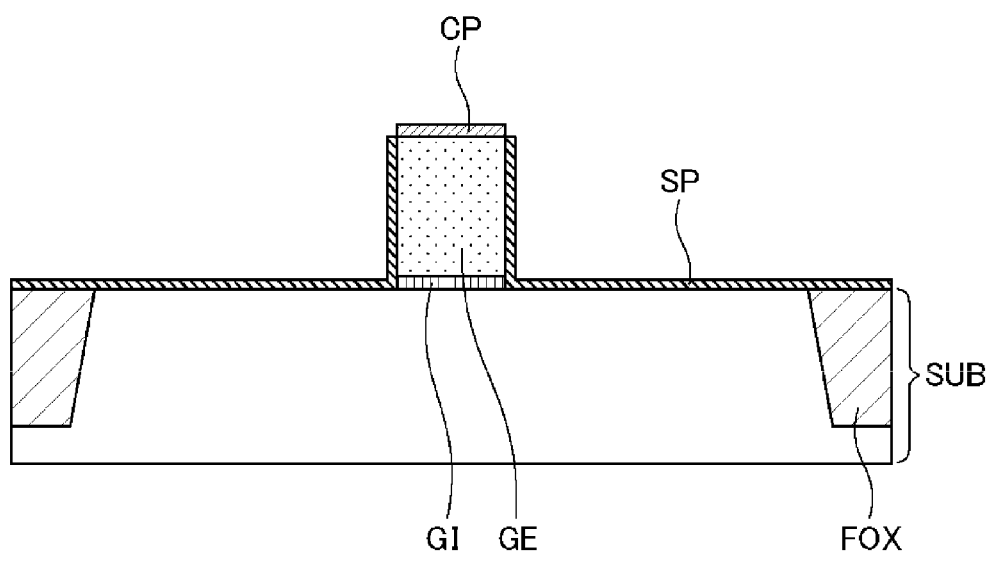
FIG. 5
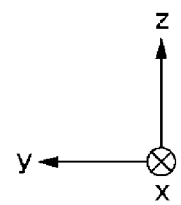

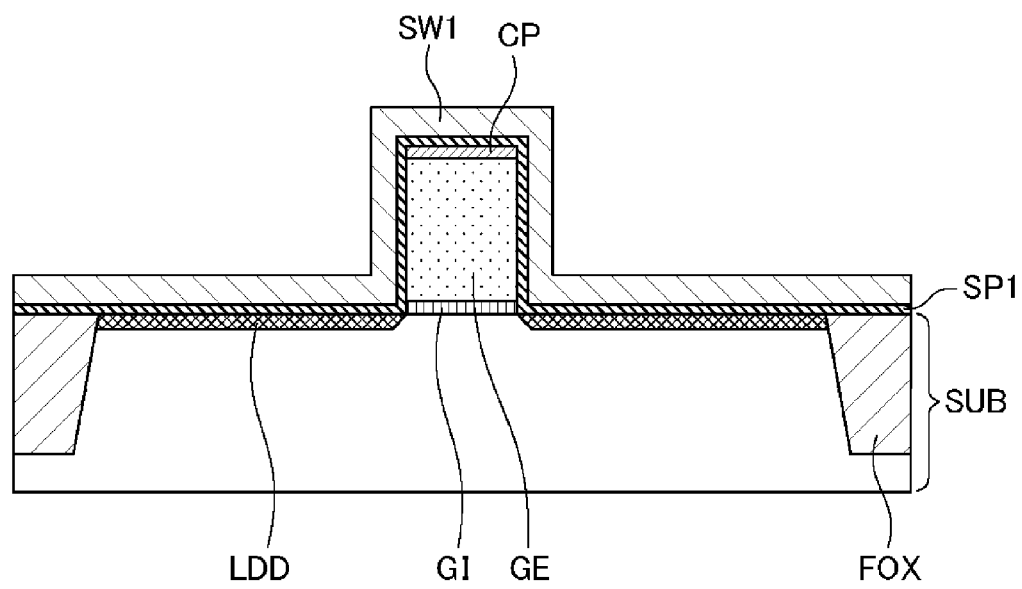
FIG. 18
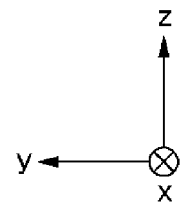

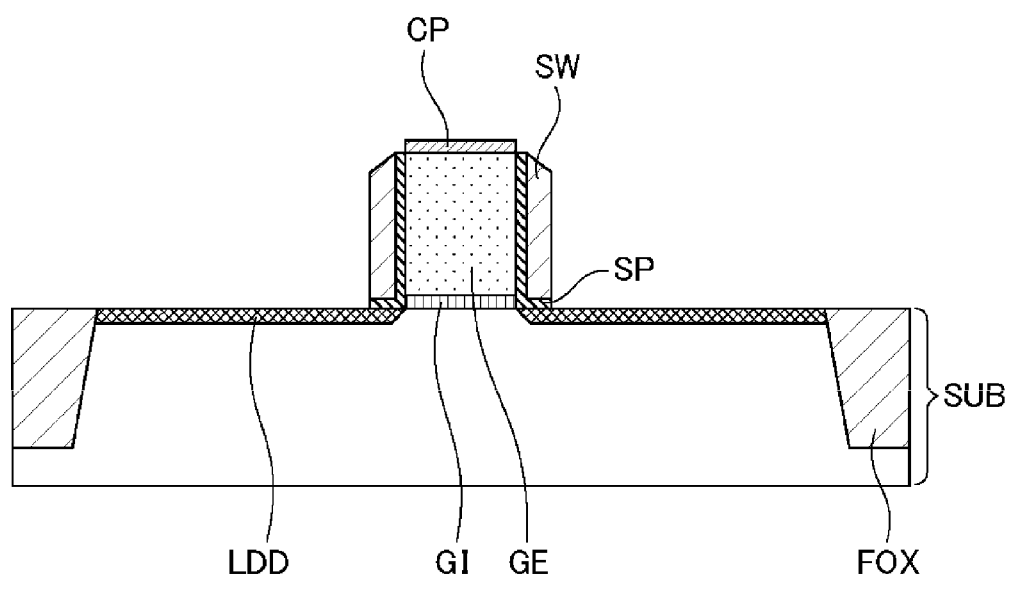
FIG. 19
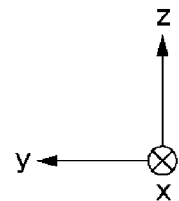

FIG. 24
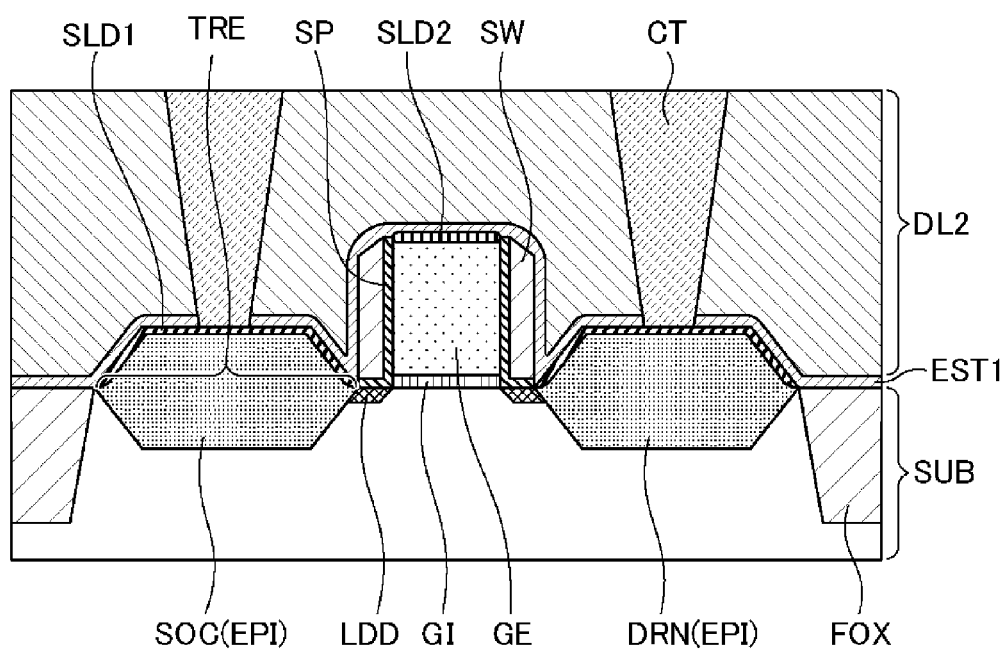
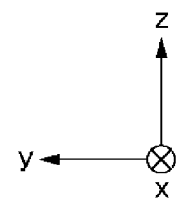

FIG. 26
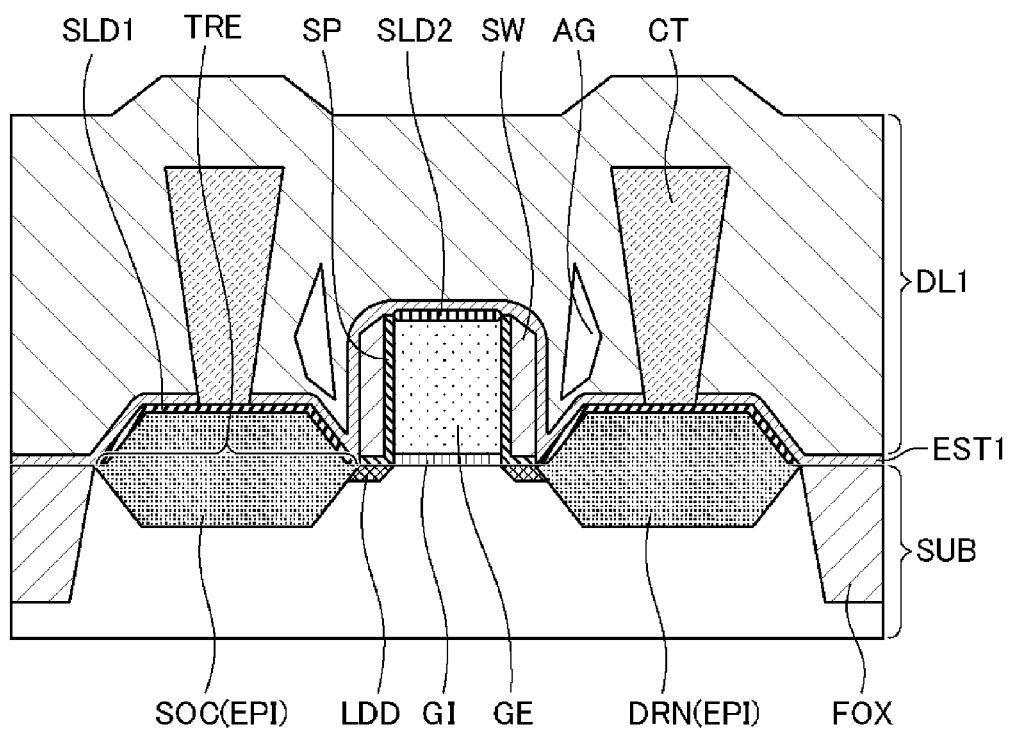
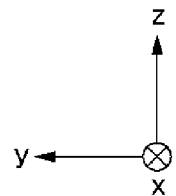

FIG. 30
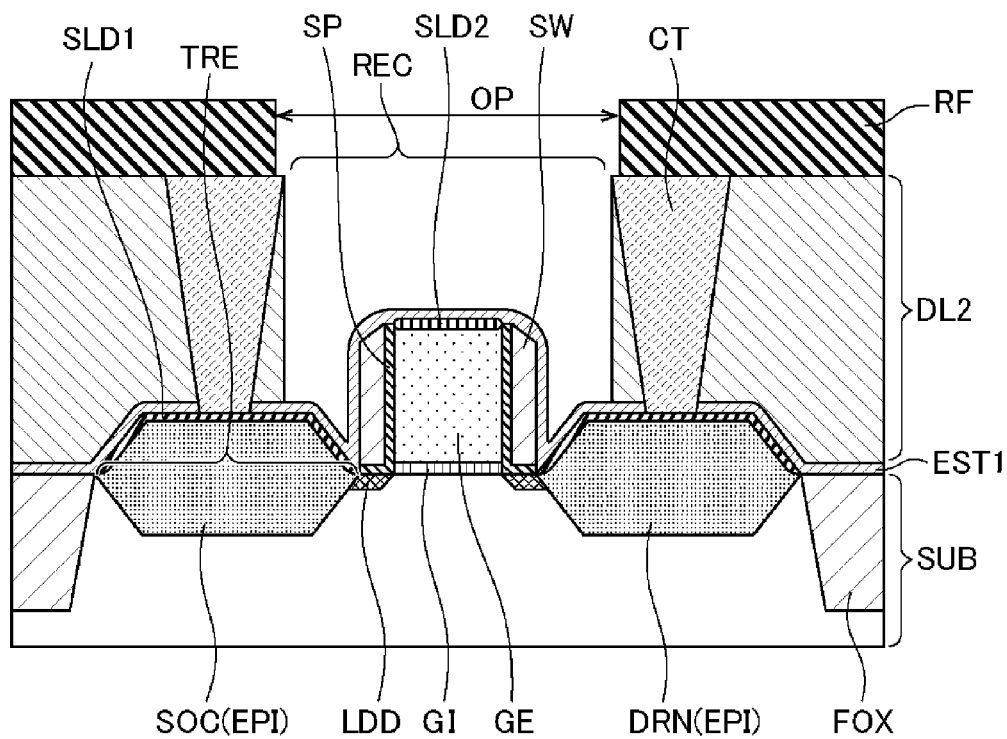
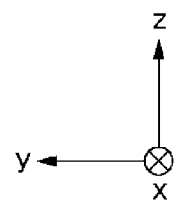

SEMICONDUCTOR DEVICE

CROSS-REFERENCE TO RELATED APPLICATION

The disclosure of Japanese Patent Application No. 2014-126211 filed on Jun. 19, 2014 including the specification, drawings and abstract is incorporated herein by reference in its entirety.

BACKGROUND

The present invention relates to semiconductor devices and relates to a technique applicable to a semiconductor device including a logic region, for example.

Presently, semiconductor devices are being miniaturized. Along with the miniaturization in a semiconductor device, the distance between the semiconductor element and a wiring and the distance between wirings become short. In this case, the parasitic capacitance formed between the semiconductor device and the wiring and the parasitic capacitance formed between the wirings come to affect the operation of the semiconductor device.

For example, in a transistor, sometimes a gate electrode and an LDD (Lightly-doped Drain) form the parasitic capacitance sandwiching a side wall. When the semiconductor element is miniaturized as above, such parasitic capacitance comes to affect the operation of the transistor. Accordingly, non-patent literature 1 (C. H. Ko, T. M. Kuan, Kangzhan Zhang, Gino Tsai, Sean M. Seutter, C. H. Wu, T. J. Wang, C. N. Ye, H. W. Chen, C. H. Ge, K. H. Wu, and W. C. Lee, "A Novel CVD-SiBCN Low-K Spacer Technology for High-Speed Applications", 2008 Symposium on VLSI Technology Digest of Technical Papers, pp. 108-109.), for example, describes the use of a low-k material for the side wall. Specifically, SiBCN is used as the low-k material in non-patent literature 1. Thereby, it is possible to reduce the parasitic capacitance formed by the gate electrode, the LDD region, and the side wall.

Further, also in a NAND flash memory, sometimes parasitic capacitance is formed by neighboring cells. Such parasitic capacitance comes to affect memory operation along with the miniaturization of the cell. Accordingly, non-patent literature 2 (Daewoong Kang, Hyungcheol Shin, Sungnum Chang, Jungjoo An, Kyongjoo Lee, Jinjoo Kim, Eunsang Jeong, Hyukje Kwon, Eunjung Lee, Seunggun Seo, and Wonseong Lee. "The Air Spacer Technology for Improving the Cell Distribution in 1 Giga Bit NAND Flash Memory" Non-Volatile Semiconductor Memory Workshop, 2006. IEEE NVSMW 2006. 21st, pp. 36-37.), for example, describes the formation of an air space between the neighboring cells. Such an air space has a low dielectric constant. Therefore, it is possible to reduce the parasitic capacitance between the neighboring cells.

SUMMARY

In a transistor, contacts coupled to a drain and a source are formed. Then, sometimes such a contact and a gate electrode sandwiches a side wall to form parasitic capacitance. The present inventors has studied how to reduce such parasitic capacitance. The other problems and novel features will become clear from the description of the present specification and the accompanying drawings.

According to one embodiment, an air gap is located between a side wall and a contact. The air gap faces the contact at the side face on the contact side via an insulating layer.

According to another embodiment, a concave part is formed in the surface of a first insulating layer which covers a gate electrode and the side wall. The concave part is located between the side wall and the contact. Then, a second insulating layer is embedded in the concave part. Further, the above air gap is formed in the second insulating layer.

According to the one embodiment described above, it is possible to reduce the parasitic capacitance formed by the gate electrode, the contact, and the side wall.

BRIEF DESCRIPTION OF THE DRAWINGS

FIG. 4 is a cross-sectional view showing a manufacturing method of the semiconductor device shown in FIG. 2 and FIG. 3;

FIG. 5 is a cross-sectional view showing a manufacturing method of the semiconductor device shown in FIG. 2 and FIG. 3;

FIG. 18 is a cross-sectional view showing a manufacturing method of the semiconductor device shown in FIG. 13 and FIG. 14;

FIG. 19 is a cross-sectional view showing a manufacturing method of the semiconductor device shown in FIG. 13 and FIG. 14;

FIG. 24 is a cross-sectional view showing a manufacturing method of the semiconductor device shown in FIG. 13 and FIG. 14;

FIG. 26 is a cross-sectional view showing a manufacturing method of the semiconductor device shown in FIG. 13 and FIG. 14;

FIG. 30 is a cross-sectional view showing a manufacturing method of the semiconductor device shown in FIG. 27 and FIG. 28;

DETAILED DESCRIPTION

Hereinafter, embodiments will be explained by the use of the drawings. Note that, in all the drawings, a same sign is attached to a same constituent, and explanation will be omitted optionally.

First Embodiment

Figure 1:
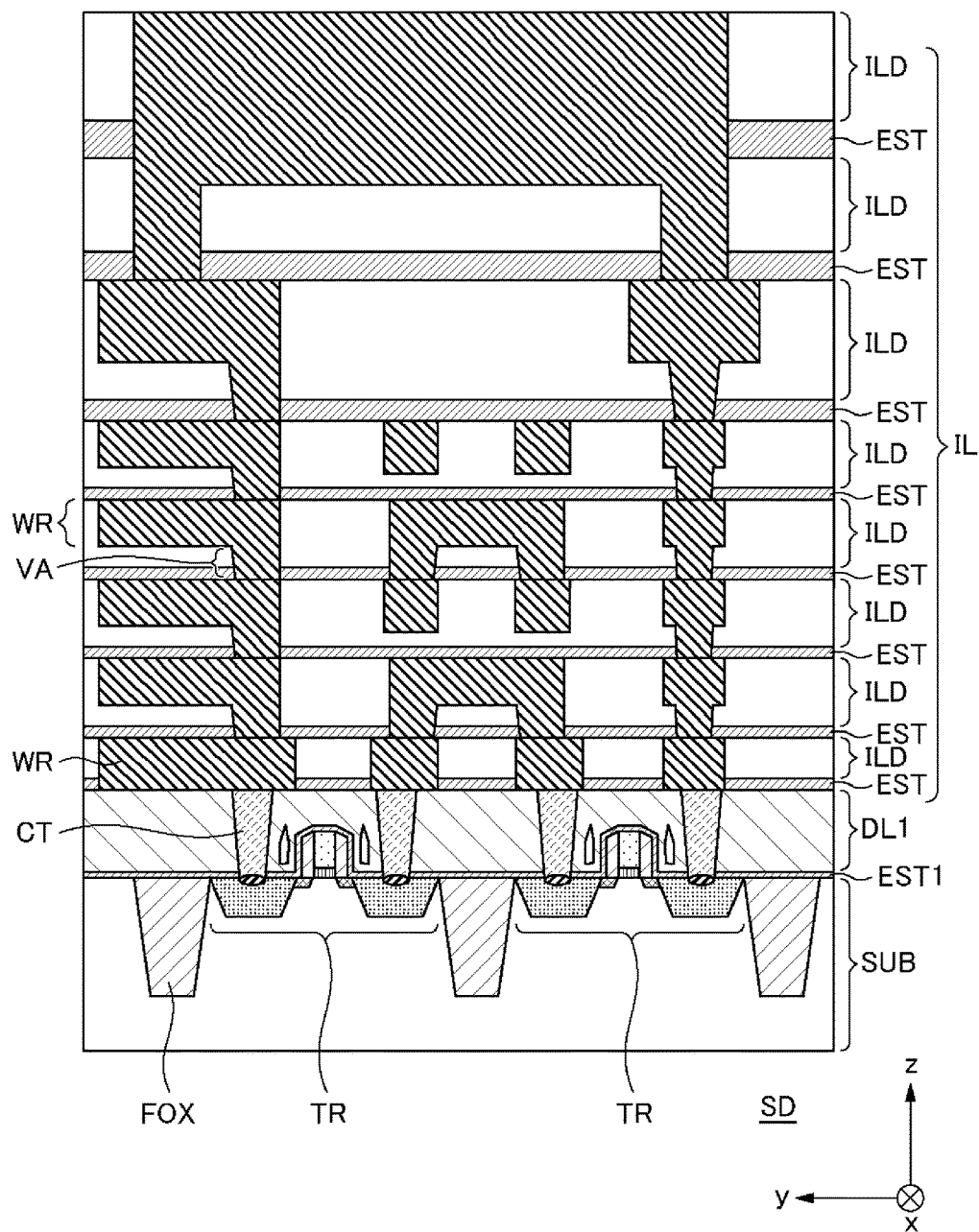
FIG. 1 is a cross-sectional view showing a configuration of a semiconductor device according to a first embodiment.

FIG. 1 is a cross-sectional view showing a configuration of a semiconductor device SD according to a first embodiment. The semiconductor device SD mounts a memory cell and a logic circuit in a mixed state over a substrate SUB. FIG. 1 shows a part configuring the logic circuit of the semiconductor device SD. Here, the substrate SUB is a semiconductor substrate and specifically a silicon substrate or an SOI (Silicon On Insulator) substrate, for example.

The semiconductor device SD includes a plurality of transistors TR over the substrate SUB. FIG. 1 shows two transistors TR. Out of these two transistors TR, one is a p-type transistor and the other one is an n-type transistor. Then, these two transistors TR are separated from each other by a field oxide film FOX (inter-element separation layer) formed over the surface of the substrate SUB. Here, the field oxide film FOX is formed by STI (Shallow Trench Isolation) or LOCOS (LOCal Oxidation of Silicon), for example. As will be explained in detail by the use of FIG. 2 and FIG. 3, each of the transistors TR includes a gate electrode GE, a gate insulating film GI, and diffusion layers DIF (source SOC and drain DRN).

The substrate SUB and the transistors TR are covered by an etching stop layer EST1. The etching stop layer EST1 is formed by a silicon nitride film (SiN), for example. An insulating layer DL1 is formed over the etching stop layer EST1. The insulating layer DL1 is formed of low-k material (e.g., SiCOH), for example.

A contact CT is formed in the insulating layer DL1. The contact CT passes through the insulating layer DL1 and the etching stop layer EST1, and is connected to one of the diffusion layers DIF of the transistor TR. Here, the contact CT is formed of tungsten (W), for example.

A wiring layer IL is formed over the insulating layer DL1. The wiring layer IL is a stacked film repeatedly stacking an etching stop layer EST and an inter-layer insulating film ILD in this order. In the example shown in FIG. 1, a wiring WR is formed over the inter-layer insulating film ILD of the lowest layer in the wiring layer IL. Then, the wiring WR of the lowest layer in the wiring layer IL is connected to one of the diffusion layers DIF of the transistor TR via the contact CT. A wiring WR and a via VA are formed in each of the inter-layer insulating films ILD located above the inter-layer insulating film ILD of the lowest layer in the wiring layer IL. The via VA is connected to the bottom faces of the wiring WR. The wiring WR and the via VA like this are formed by dual damascene, for example. The above logic circuit is configured with the transistor TR, the contact CT, the wiring WR, and the via VA.

Figure 2:
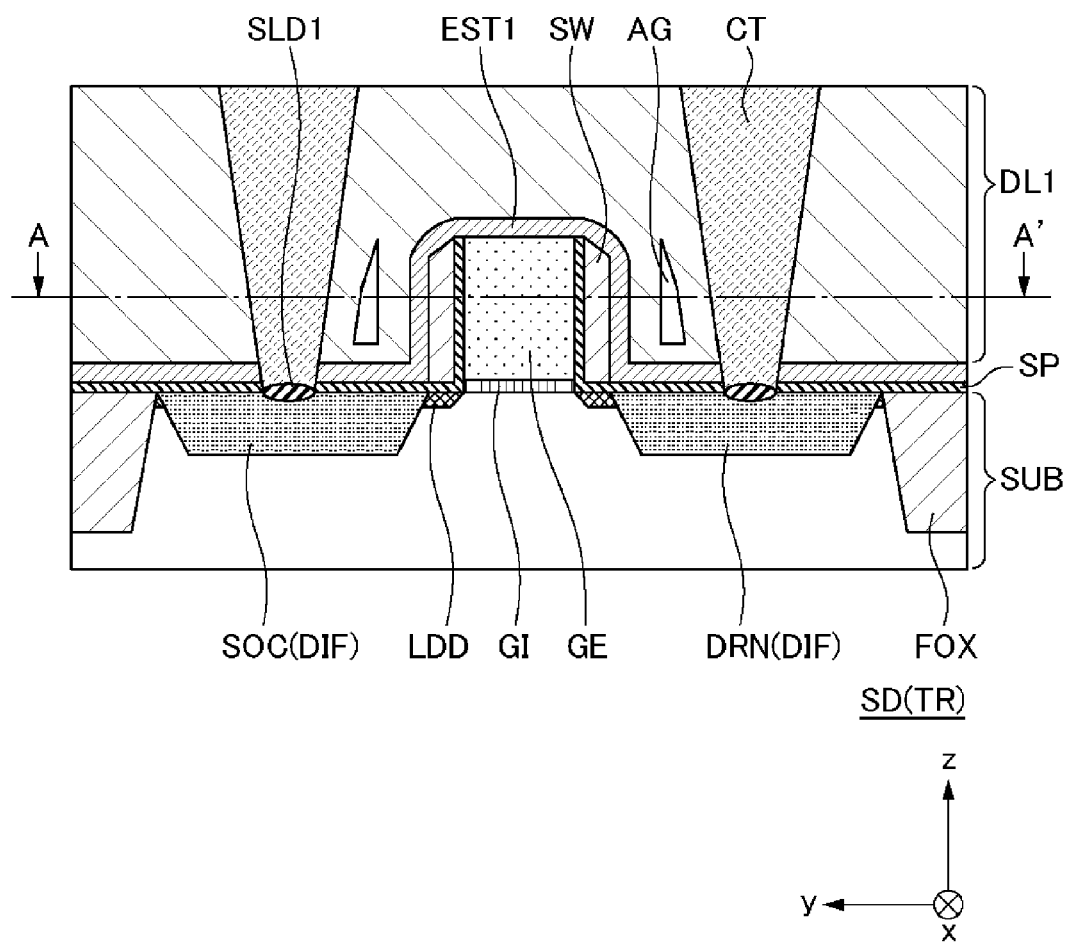
FIG. 2 is an enlarged view of a relevant part in FIG. 1.

FIG. 2 is an enlarged view of a relevant part in FIG. 1. The transistor TR is formed over the substrate SUB. Then, the transistor includes the gate electrode GE, the gate insulating film GI, and the diffusion layers DIF (source SOC and drain DRN). The gate electrode GE is located over the substrate SUB. The gate electrode GE is formed of poly-silicon or metal, for example. The gate insulating film GI is located between the substrate SUB and the gate electrode GE. The gate insulating film GI is formed by a silicon oxide ($SiO_2$) film or a high-k material (e.g., hafnium silicon oxynitride (HfSiON) film, for example. The diffusion layers DIF are formed in regions facing each other via the gate electrode GE. Then, out of the diffusion layers DIF, one functions as the source SOC and the other one functions as the drain DRN.

Side walls SW are formed on the side faces of the gate electrode GE. The side walls SW are formed of low-k material (e.g., silicon carbide (SiCN)), for example.

In the example shown in FIG. 2, a spacer film SP is formed along the side faces of the gate electrode GE and the surface of the substrate SUB. In this case, the spacer film SP is sandwiched by the side faces of the gate electrode GE and the side walls SW over the side faces of the gate electrode GE. Further, the spacer film SP is sandwiched by the gate electrode GE and the substrate SUB under the gate electrode GE. The spacer film SP is formed by a silicon oxide ($SiO_2$) film, for example.

Further, in the example shown in FIG. 2, LDD regions LDD (Lightly-Doped Drain) are formed between the gate electrode GE and each of the diffusion layers DIF. Each of the LDD regions LDD has the same conduction type as the diffusion layers DIF and also has an impurity concentration lower than those of the diffusion layers DIF.

The gate electrode GE, the side walls SW, and the spacer film SP are covered by the etching stop layer EST1. Further, the insulating layer DL1 is located over the etching stop layer EST1. Here, the etching stop layer EST1 is formed by a silicon nitride (SiN) film, for example. On the other side, the insulating layer DL1 is formed of low-k material (e.g., SiCOH), for example.

The contact CT passes through the insulating layer DL1, the etching stop layer EST1, and the spacer film SP and is connected to one of the diffusion layers DIF. In this case, the contact CT has the side face contacting the spacer film SP at the bottom part of the contact CT. In the example shown in FIG. 2, the contact CT is provided for each of the source SOC and the drain DRN. Further, in the example shown in FIG. 2, the contact CT has a width becoming narrower from the upper end toward the lower end.

A Silicide layer SLD1 is formed over the surface layer in each of the diffusion layers DIF, at the bottom face of the contact CT. The contact CT is connected to one of the diffusion layers DIF via the silicide layer SLD1. The silicide layers SLD1 contain nickel (Ni), for example.

An air gap AG is located between one of the side walls SW and the contact CT. The air gap AG is formed in the insulating layer DL1 and is a hollow within the insulating layer DL1. In other words, any inner wall part of the air gap AG is covered by the insulating layer DL1. In this case, the air gap AG faces the contact CT at the side face on the contact CT side via the insulating layer DL1. Further, the air gap AG faces one of the side walls SW at the side face on the side wall SW side via the insulating layer DL1. Further, the air gap AG faces the substrate SUB at the side face on the substrate SUB side via the insulating layer DL1.

Then, as described above, the air gap AG is the hollow within the insulating layer DL1. Accordingly, the air gap AG substantially becomes a low dielectric constant region. In this case, it is possible to reduce the parasitic capacitance between the contact CT and the gate electrode GE.

Figure 3:
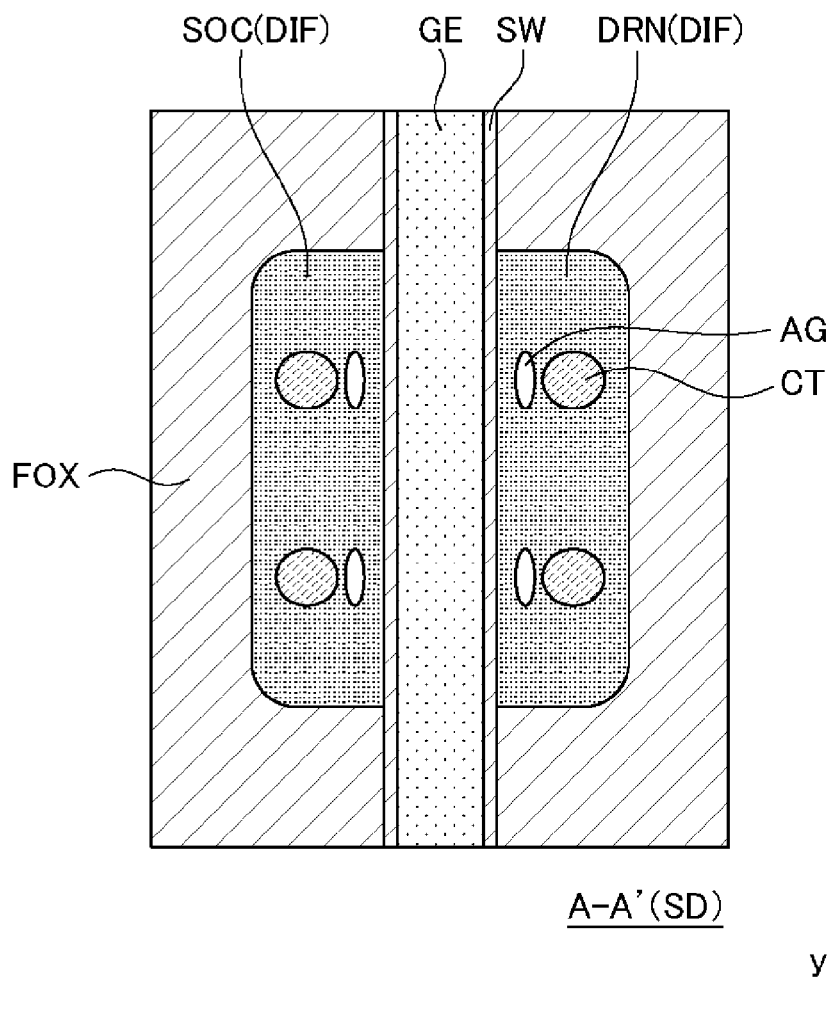
FIG. 3 is a cross-sectional view along A-A' line of FIG. 2.

FIG. 3 is a cross-sectional view along A-A' line of FIG. 2. The gate electrode GE extends in a first direction (x-axis direction in FIG. 3) in a plan view. Then, also the side walls SW extend in the first direction in the plan view. Further, in the example shown in FIG. 3, also the source SOC and the drain DRN (diffusion layers DIF) extend in the first direction.

In the present embodiment, for each of the source SOC and the drain DRN, the contact CT is arranged in plurality along the first direction (x-axis direction in FIG. 3). Note that the number of the contacts CT arranged for each of the source SOC and the drain DRN is not limited to the example (plural number) shown in FIG. 3. For example, the number of contacts CT arranged for each of the source SOC and the drain DRN may be only one.

The air gap AG is located between one of the side walls SW and the contact CT. In more detail, the air gap AG is located between one of the side walls SW and the contact CT in a second direction (y-axis in FIG. 3) perpendicular to the first direction in the plan view. In other words, the air gap AG is formed at a position where the width of the insulating layer DL1 is made narrow by one of the side walls SW and the contact CT.

Further, in the example shown in FIG. 3, as described above, the plurality of contacts CT is arranged along the first direction (x-axis direction in FIG. 3). Then, the air gap AG is provided for each of the plurality of contacts CT. Specifically, the air gap AG is located between each of the contacts CT and one of the side walls SW. Then, the air gap AG is separated from each other in the first direction.

FIG. 4 to FIG. 12 are cross-sectional views showing a manufacturing method of the semiconductor device SD shown in FIG. 2 and FIG. 3. First, as shown in FIG. 4, the field oxide film FOX (inter-element separation layer) is formed over the substrate SUB. Thereby, a region where an element (transistor in the present embodiment) is formed and the external region thereof are separated by the field oxide film FOX. Next, on the substrate SUB, an insulating film GI1, a poly-silicon film PS, and an insulating film CP1 are formed in this order. The insulating film GI1 is an insulating film to be used as the gate insulating film GI. The poly-silicon film PS is a conductor film to be used as the gate electrode GE. The insulating film CP1 is an insulating film (e.g., silicon nitride (SiN) film) to be used as a cap insulating film CP covering the upper face of the gate electrode GE, as will be described below (FIG. 5). While details will be described below, the cap insulating film CP is an insulating film for preventing the spacer film SP (FIG. 2) from being formed over the upper face of the gate electrode GE.

Next, as shown in FIG. 5, the poly-silicon film PS, the insulating film GI1, and the insulating film CP1 are patterned. Thereby, the gate electrode GE, the gate insulating film GI, and the cap insulating film CP are formed. Subsequently, the substrate SUB and the gate electrode GE are provided with thermal oxidation. Thereby, the spacer film SP (e.g., silicon oxide (SiO$_2$) film) is formed over the surface of the substrate SUB and the side faces of the gate electrode GE. Here, the upper face of the gate electrode GE is covered by the cap insulating film CP in this thermal oxidation process. Thereby, the spacer film SP is not formed over the upper face of the gate electrode GE.

Figure 6:
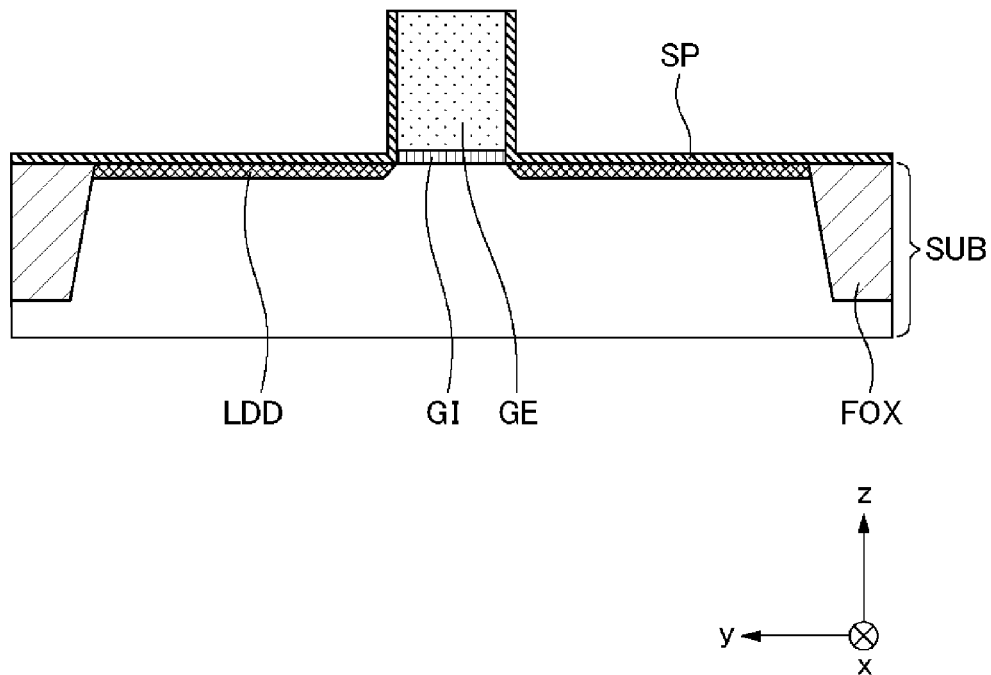
FIG. 6 is a cross-sectional view showing a manufacturing method of the semiconductor device shown in FIG. 2 and FIG. 3.

Next, as shown in FIG. 6, the cap insulating film CP is removed by etching. In the example shown in FIG. 6, the etching rate of the cap insulating film CP is configured to be higher than the etching rate of the spacer film SP. Therefore, the cap insulating film CP can be removed selectively with respect to the spacer film SP. Subsequently, ion implantation is provided for the surface of the substrate SUB by the use of the gate electrode GE and the field oxide film FOX as masks. Thereby, the LDD regions LDD are formed.

Figure 7:
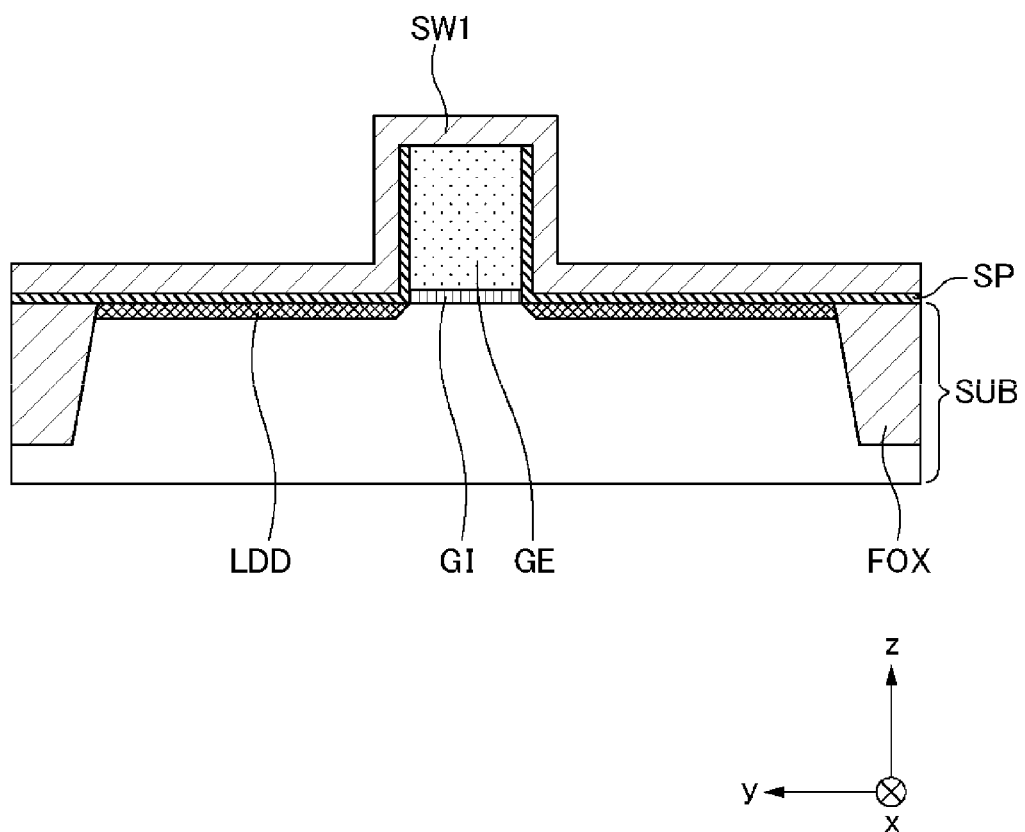
FIG. 7 is a cross-sectional view showing a manufacturing method of the semiconductor device shown in FIG. 2 and FIG. 3.

Next, as shown in FIG. 7, an insulating film SW1 is formed over the substrate SUB and the gate electrode GE. Thereby, the substrate SUB and the gate electrode GE are covered by the insulating film SW1. The insulating film SW1 is an insulating film to be used as the side walls SW.

Figure 8:
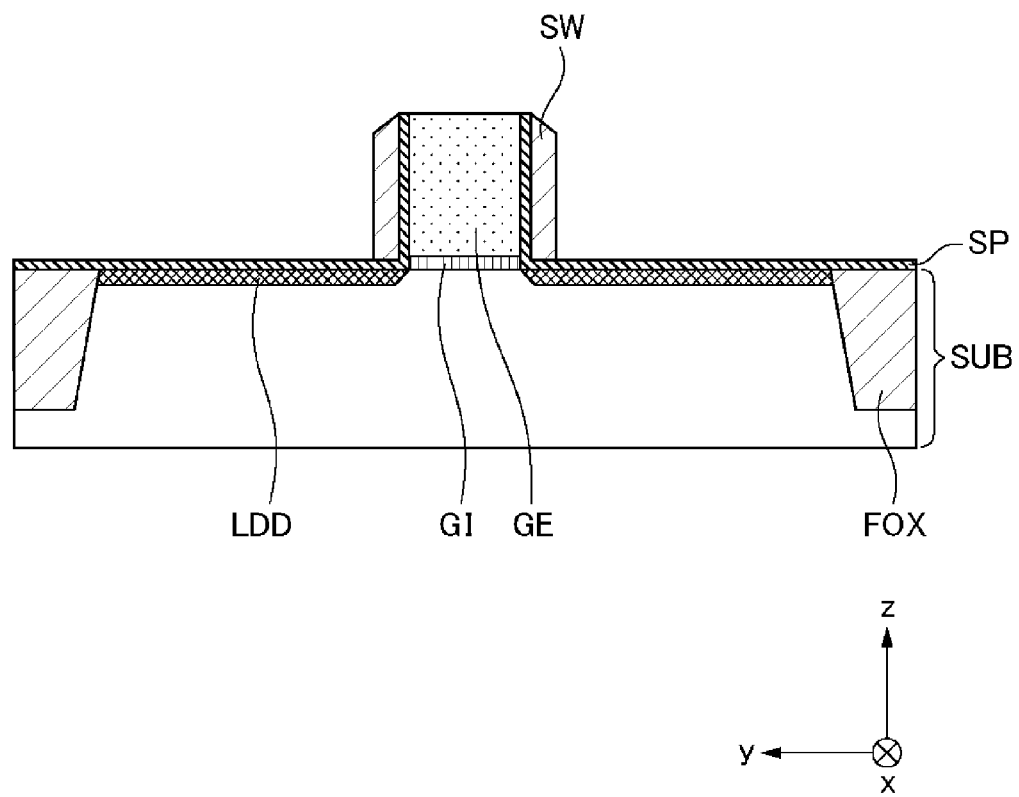
FIG. 8 is a cross-sectional view showing a manufacturing method of the semiconductor device shown in FIG. 2 and FIG. 3.

Next, as shown in FIG. 8, the insulating film SW1 is provided with etch-back. Thereby, the side walls SW are formed. Note that, in FIG. 8, for simple explanation, the thickness of the spacer film SP is shown to be the same between parts not covered by the side walls SW and parts covered by the side walls SW. In an actual process, however, the thickness of the spacer film SP is smaller in the parts not covered by the side walls SW than in the parts covered by the side walls SW, depending on an etching condition.

Figure 9:
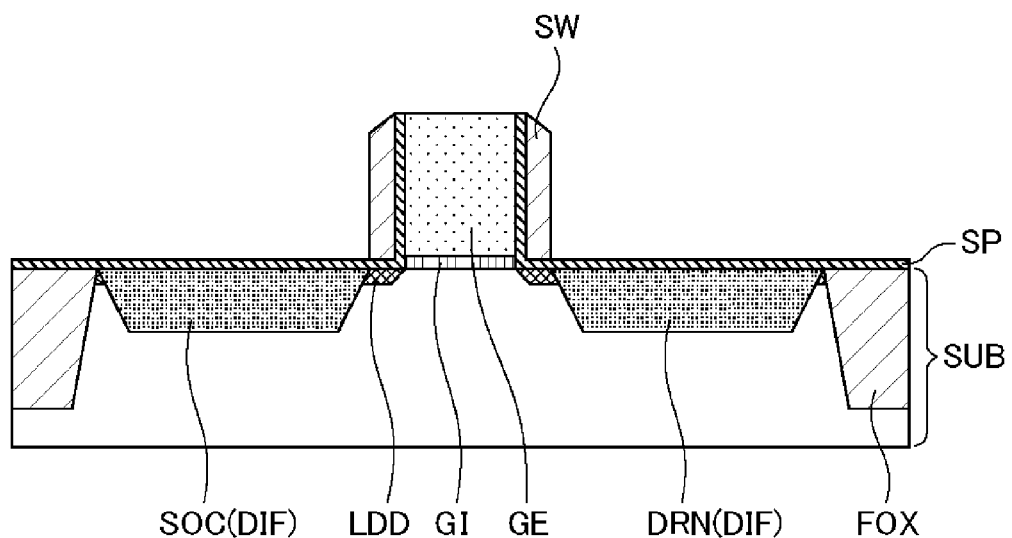
FIG. 9 is a cross-sectional view showing a manufacturing method of the semiconductor device shown in FIG. 2 and FIG. 3.

Next, as shown in FIG. 9, ion implantation is provided for the surface of the substrate SUB by the use of the gate electrode GE, the side walls SW, and the field oxide film FOX as masks. Thereby, the diffusion layers DIF (source SOC and drain DRN) are formed. Here, in the example shown in FIG. 9, the spacer film SP is formed over the surface of the substrate SUB. Accordingly, in the above ion implantation, ions are implanted into the surface of the substrate SUB via the spacer film SP.

Figure 10:
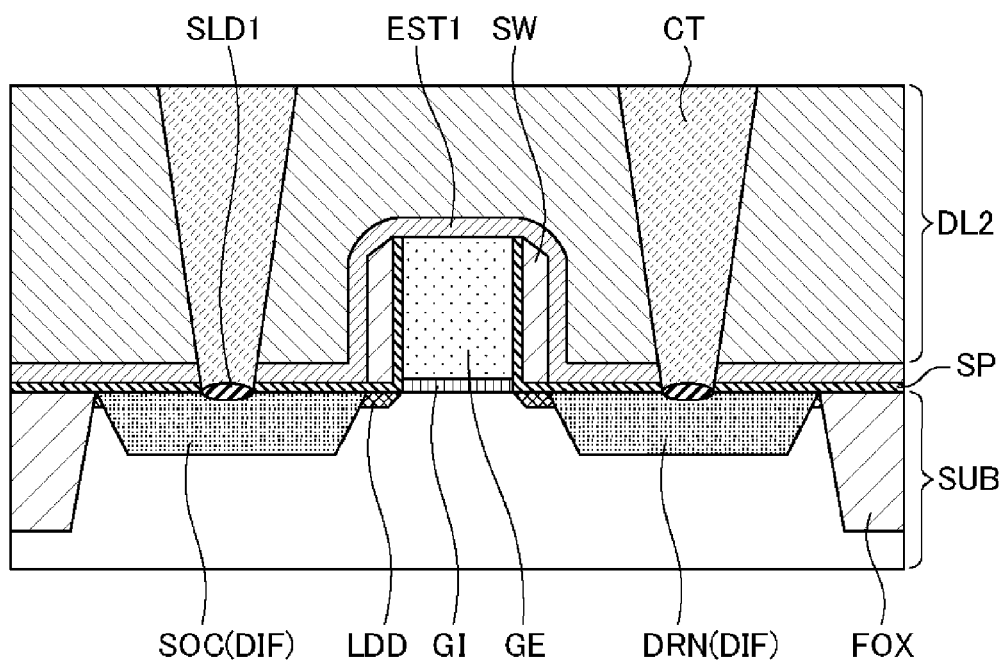
FIG. 10 is a cross-sectional view showing a manufacturing method of the semiconductor device shown in FIG. 2 and FIG. 3.

Next, as shown in FIG. 10, the etching stop layer EST1 and an insulating layer DL2 are formed in this order over the gate electrode GE, the side walls SW, and the substrate SUB. The etching stop layer EST1 is a silicon nitride (SiN) film, for example. On the other side, the insulating layer DL2 is a silicon oxide (SiO2) film, for example. Subsequently, the surface layer of the insulating layer DL2 is removed by CMP (Chemical Mechanical Polishing), for example. Thereby, the upper surface of the insulating layer DL2 is made flat.

Next, a connection hole is formed in the insulating layer DL2. The connection hole passes through the insulating layer DL2, the etching stopper layer EST1, and the spacer film SP and reaches one of the diffusion layers DIF. The contact CT is formed in this connection hole in a subsequent process. Next, a metal film (e.g., nickel (Ni) film) is formed over the insulating layer DL2. Thereby, this metal film is embedded at least at the bottom part of the above connection hole. Subsequently, the substrate SUB is provided with annealing. Thereby, the silicide layer SLD1 is formed over the surface layer in one of the diffusion layers DIF at the bottom surface of the above connection hole. Next, the above metal film is removed. Here, the above metal film is a metal for forming the silicide layer SLD1 over each of the diffusion layers DIF. Accordingly, this metal needs not fill the contact CT completely.

Next, a metal film (e.g., tungsten (W) film) is formed over the insulating layer DL2. Thereby, this metal film is embedded into the above connection hole. Thereby, the contact CT is formed in the insulating layer DL2. The contact CT passes through the insulating layer DL2, the etching stop Layer EST1, and the spacer film SP and is connected to one of the diffusion layers DIF.

Figure 11:
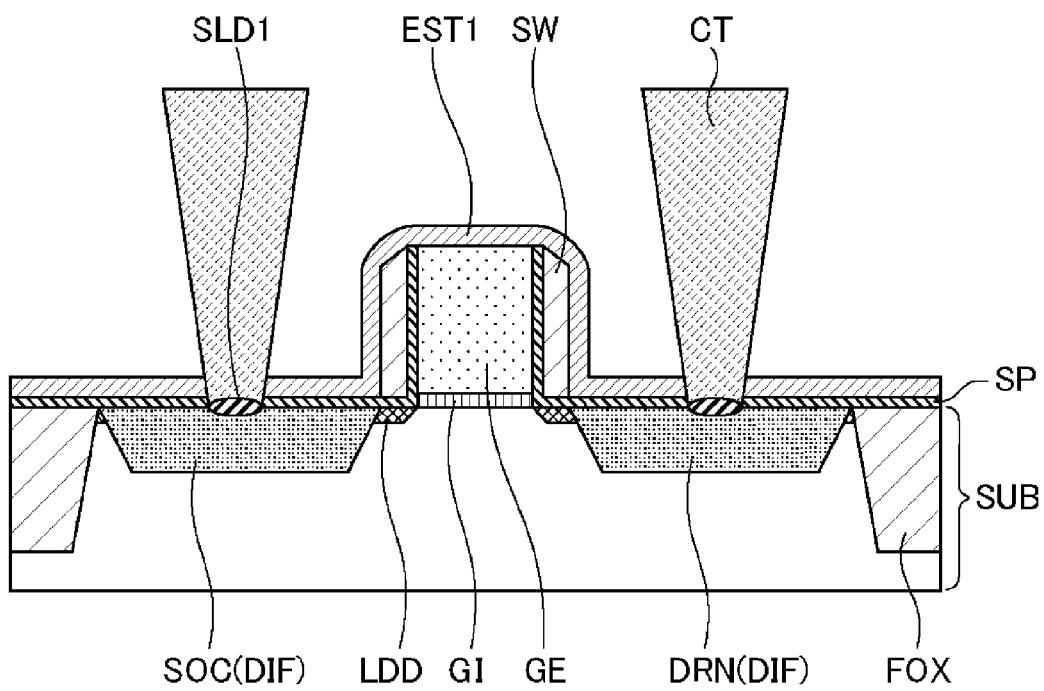
FIG. 11 is a cross-sectional view showing a manufacturing method of the semiconductor device shown in FIG. 2 and FIG. 3.

Next, as shown in FIG. 11, the insulating layer DL2 (FIG. 10) is removed by etching. For the etching in this case, either dry etching (e.g., etching using reactive ion etching (RIE)) or wet etching (e.g., etching using buffered hydrofluoric acid (BHF)) may be used. This etching is terminated at the surface layer of the etching stop layer EST1. In other words, the insulating layer DL2 is removed selectively.

Further, in the example shown in FIG. 11, the side face of the contact CT contacts the etching stop layer EST1 and the spacer film SP at the bottom part of the contact CT. In other words, the bottom part of the contact CT is fixed by the etching stop layer EST1 and the spacer film SP. Accordingly, without the insulating layer DL2, it is possible to prevent the contact CT from falling down easily.

Note that, without forming the etching stop layer EST1, by adjusting the etching rates of the side walls SW and the spacer film SP, it is possible to remove the insulating layer DL2 selectively. Specifically, the etching rates of the side walls SW and the spacer film SP are made smaller than the etching rate of the insulating layer DL2. In other words, the etching selectivity of the insulating layer DL2 is made higher with respect to the side walls SW and the spacer film SP. Also in this case, it is possible to remove the insulating layer DL2 selectively.

Figure 12:
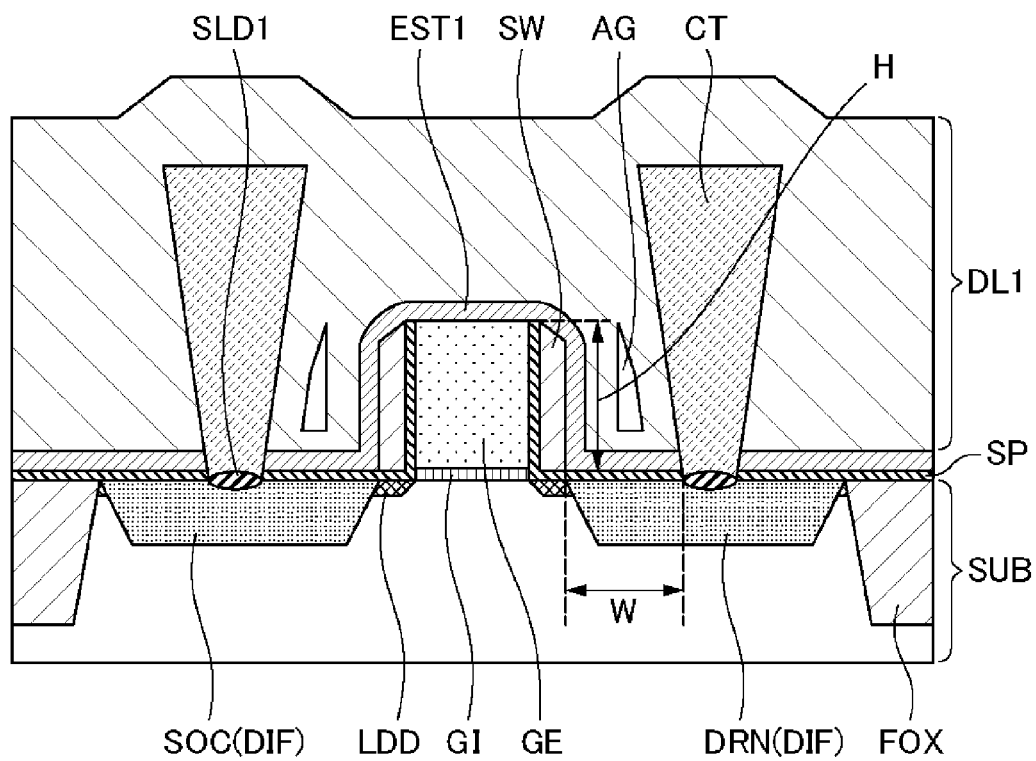
FIG. 12 is a cross-sectional view showing a manufacturing method of the semiconductor device shown in FIG. 2 and FIG. 3.

Next, as shown in FIG. 12, the insulating layer DL1 is formed over the gate electrode GE, the side walls SW, the substrate SUB, and the contact CT. The insulating layer DL1 is formed by chemical vapor deposition (CVD), for example. Thereby, the air gap AG is formed between one of the side walls SW and the contact CT.

In detail, in the example shown in FIG. 12, a space is formed between one of the side walls SW and the contact CT. Then, the aspect ratio of the height (H) in this space with respect to the width (W) in this spaces (H/W) is configured to be high. In the example of FIG. 12, the above width W corresponds to a gap between the bottom part in one of the side walls SW and the bottom part of the contact CT. On the other side, the above height H corresponds to the height in each of the side walls SW. This aspect ratio is configured to be not smaller than 1.0, for example. When the above aspect ratio is high, it is difficult to embed the insulating layer DL1 between one of the side walls SW and the contact CT. Here, the above width W is not wider than 50 nm, for example.

Then, in the example shown in FIG. 12, the contact CT has a width increasing from the lower face toward the upper face of the insulating layer DL1. Thereby, the space between one of the side walls SW and the contact CT becomes smaller at the upper side part. Therefore, the insulating layer DL1 does not enter this space easily, and therefore it is further difficult to embed the insulating film DL1.

In this manner, it is difficult to embed the insulating layer DL1 between one of the side walls SW and the contact CT. Accordingly, when the insulating layer DL1 is deposited between one of the side walls SW and the contact CT, the insulating layer DL1 is deposited so as to go around a region where the air gap AG is to be formed. Thereby, the side face of the air gap AG on the contact CT side faces the contact CT via the insulating layer DL1. On the other side, the side face of the air gap AG on the side wall SW side faces one of the side walls SW via the insulating layer DL1.

Next, the surface layer of the insulating layer DL1 is removed by CMP, for example. In this case, the upper face of the insulating layer DL1 is removed until the upper face of the contact CT is exposed. Thereby, the upper face of the insulating layer DL1 is made flat. As above, the semiconductor device SD shown in FIG. 2 and FIG. 3 is manufactured.

As above, according to the present embodiment, the air gap AG is formed between one of the side walls SW and the contact CT. Thereby, it is possible to reduce the parasitic capacitance between the gate electrode GE and the contact CT. Further, the air gap AG faces the contact CT at the side face on the contact CT side via the insulating layer DL1. In other words, the air gap AG does not contact the contact CT. Thereby, the withstand voltage between the gate electrode GE and the contact CT is prevented from degrading.

Further, according to the present embodiment, the air gap AG is formed after the contact CT has been formed (FIG. 10 and FIG. 12). If the contact CT is formed after the air gap AG has been formed, the metal of the contact CT might enter the air gap AG. For this problem, the present embodiment can prevent such a phenomenon from being caused.

Second Embodiment

Figure 13:
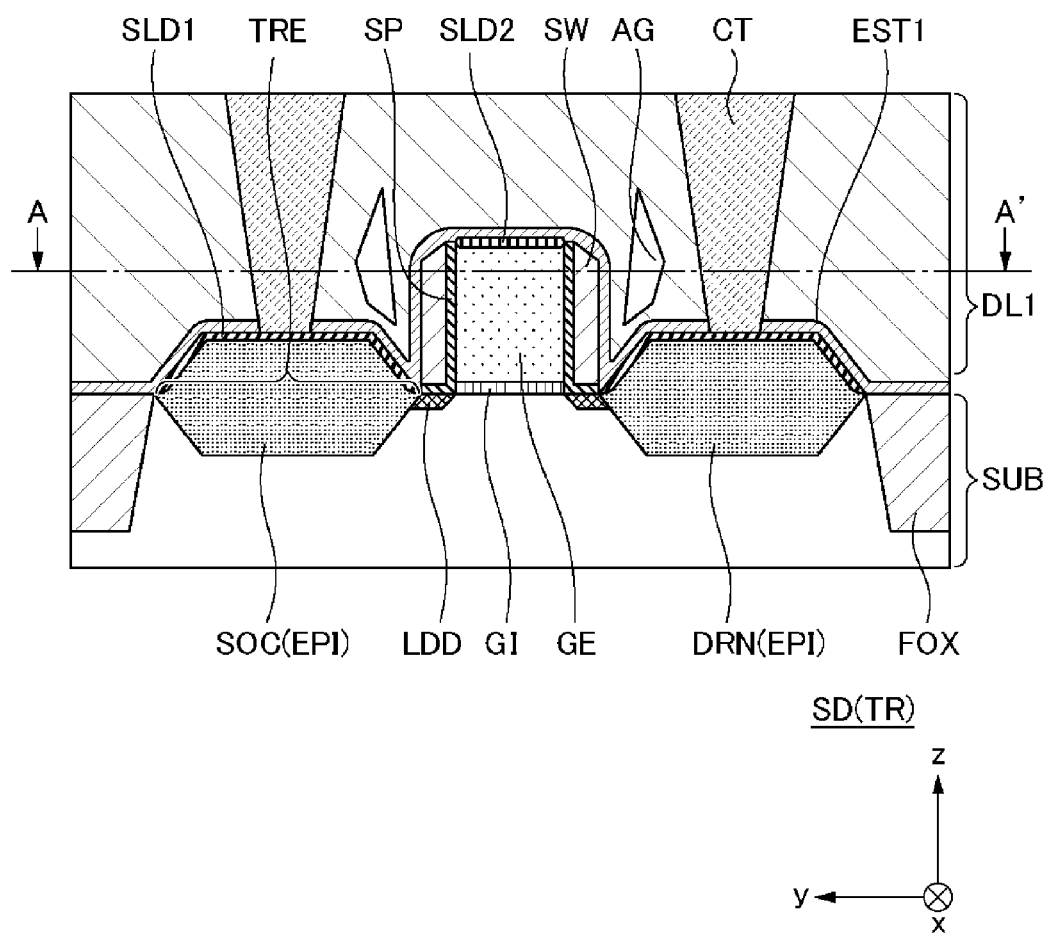
FIG. 13 is a cross-sectional view showing a configuration of a semiconductor device according to a second embodiment.
Figure 14:
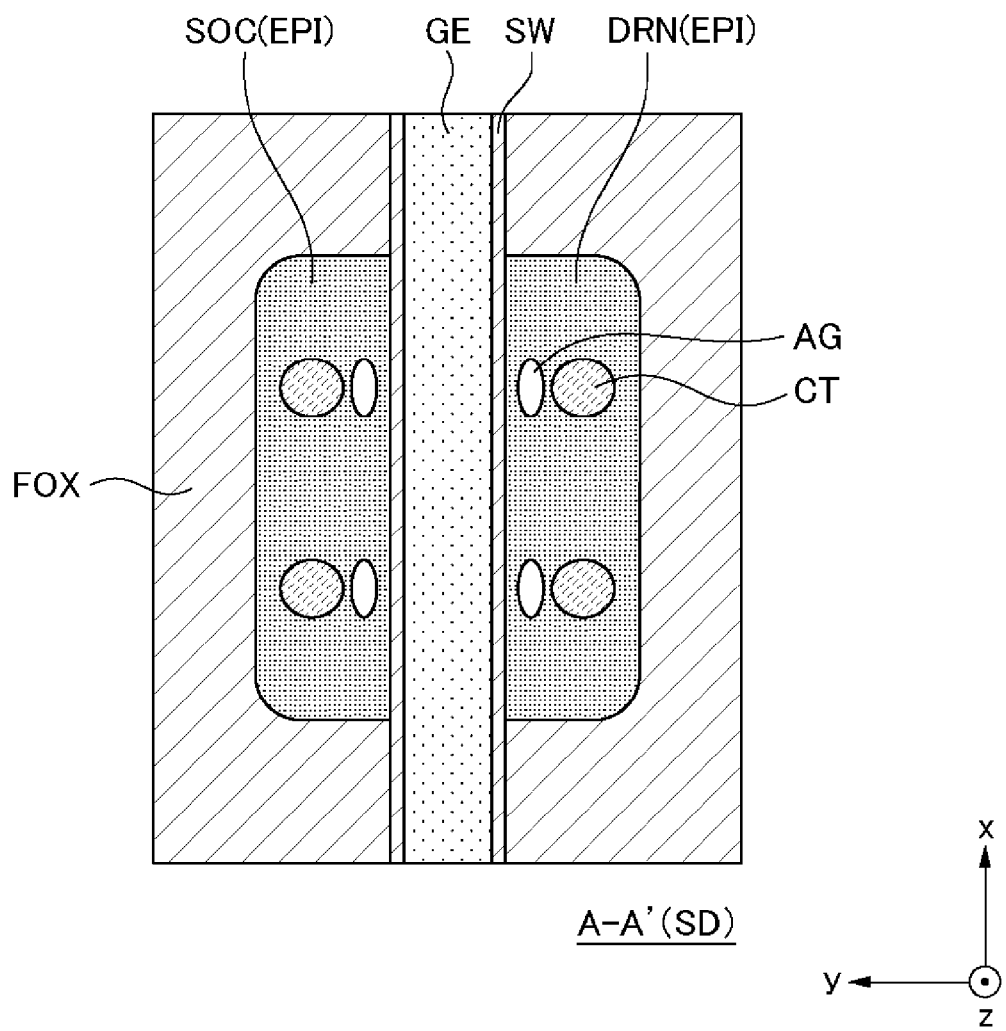
FIG. 14 is a cross-sectional view along A-A' line of FIG. 13.

FIG. 13 is a cross-sectional view showing a configuration of a semiconductor device SD according to a second embodiment, and corresponds to FIG. 2 of the first embodiment. FIG. 14 is a cross-sectional view along A-A' line of FIG. 13, and corresponds to FIG. 3 of the first embodiment. The semiconductor device SD according to the present embodiment has the same configuration as the semiconductor device SD according to the first embodiment except that a source SOC and a drain DRN are configured with epitaxial layers EPI (semiconductor layers).

As shown in FIG. 13, trenches TRE are formed in the surface of a substrate SUB. In this case, the trenches TRE have openings in the surface of the substrate SUB. Then, the epitaxial layers EPI are embedded in the trenches TRE. The surface layer in each of the epitaxial layers EPI protrudes from the opening of the corresponding trench TRE. Then, the side faces of the above surface layer in each of the epitaxial layers EPI are sloped in respective directions in which the area of the epitaxial layer EPI decreases toward the top. In other words, the side face on the side wall SW side of the above surface layer in each of the epitaxial layers EPI is configured to go apart from one of the side walls SW toward the top.

In the above case, a narrow space is formed between the above side face in each of the epitaxial layers EPI and one of the side walls SW. Then, the width of the space becomes wider from the bottom toward the top. Accordingly, when an insulating layer DL1 is embedded into this space, the insulating layer DL1 is embedded into this space so as to cause the upper face thereof to have a concave part at the center part of the space. Then, when the insulating layer DL1 is deposited further over this space, an air gap AG is formed so as to succeed the above concave part. Thereby, in the example shown in FIG. 13, it is possible to form the gap AG having a large size compared with the first embodiment (FIG. 2).

Here, in the example shown in FIG. 13, a spacer film SP is located only between a gate electrode GE and the substrate SUB, in a part formed along the surface of the substrate SUB. In other words, the spacer film SP does not cover the surface layer of the epitaxial layers EPI. Then, in the example shown in FIG. 13, a silicide layer SLD1 is formed over the surface layer in each of the epitaxial layers EPI.

As shown in FIG. 14, the gate electrode GE, the side walls SW, and the epitaxial layers EPI (source SOC and drain DRN) extend in the first direction (x-axis direction in FIG. 13) in a plan view as in the first embodiment (FIG. 3). Further, a contact CT is arranged in plurality along the first direction. Then, the air gap AG is located in each of regions sandwiched by one of the side walls SW and the plurality of contacts CT in the second direction (y-axis direction in FIG. 14).

In the example shown in FIG. 14, as described above, the size of the air gap AG is larger that of the first embodiment. Specifically, as shown in FIG. 14, the planer shape of the air gap AG has a larger width between the contact CT and one of the side walls SW than that of the first embodiment (FIG. 3).

Figure 15:
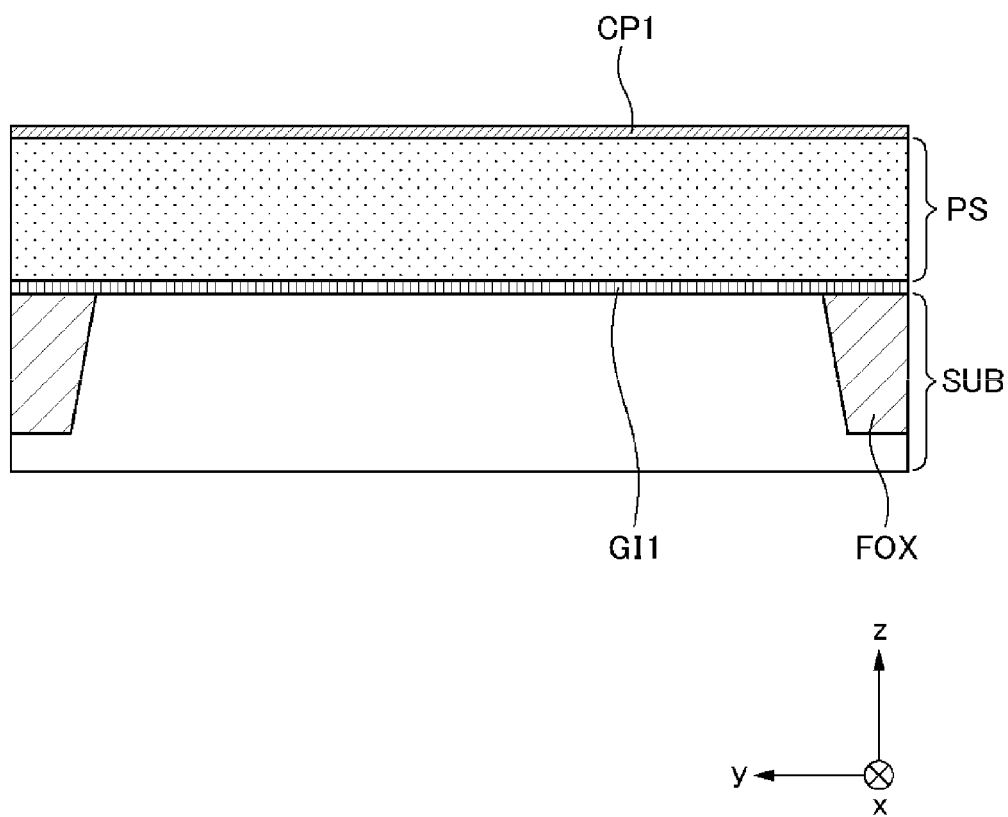
FIG. 15 is a cross-sectional view showing a manufacturing method of the semiconductor device shown in FIG. 13 and FIG. 14.

FIG. 15 to FIG. 26 are cross-sectional views showing a manufacturing method of the semiconductor device SD shown in FIG. 13 and FIG. 14. First, as shown in FIG. 15, a field oxide film FOX (inter-element separation layer) is formed over the substrate SUB. Subsequently, an insulating film GI1, a poly-silicon film PS, and an insulating film CP1 are stacked over the substrate SUB in this order. As will be described below, the insulating film CP1 is to be used as a cap insulating film CP (FIG. 16) to cover the upper face of the gate electrode GE. Here, the insulating film CP1 is formed by a silicon oxide (SiO2) film, for example.

Figure 16:
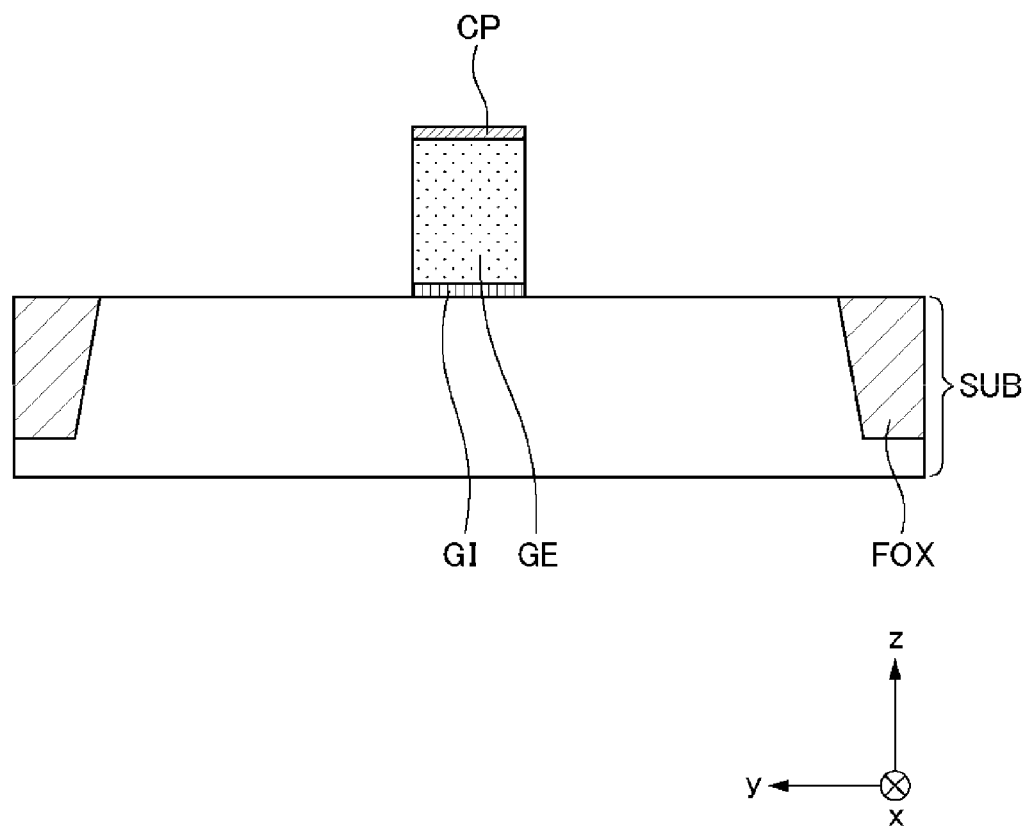
FIG. 16 is a cross-sectional view showing a manufacturing method of the semiconductor device shown in FIG. 13 and FIG. 14.

Next, as shown in FIG. 16, the insulating film CP1, the poly-silicon film PS, and the insulating film GI1 are patterned. Thereby, the cap insulating film CP, the gate electrode GE, and a gate insulating film GI are formed. The cap insulating film CP is located over the upper face of the gate electrode GE. As will be described below, the cap insulating film CP (e.g., silicon oxide (SiO2) film) is an insulating film for preventing an epitaxial layer from being formed over the upper face of the gate electrode GE.

Figure 17:
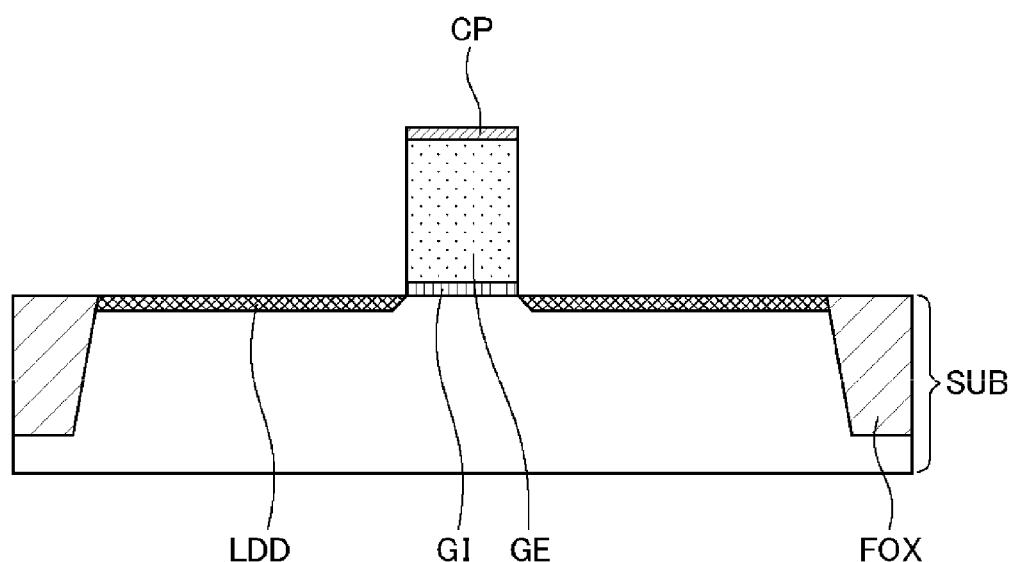
FIG. 17 is a cross-sectional view showing a manufacturing method of the semiconductor device shown in FIG. 13 and FIG. 14.

Next, as shown in FIG. 17, ion implantation is provided for the surface of the substrate SUB by the use of the gate electrode GE and the field oxide film FOX as masks. Thereby, the LDD regions LDD are formed.

Next, as shown in FIG. 18, an insulating film SP1 and an insulating film SW1 are formed in this order over the substrate SUB and the gate electrode GE. Thereby, the substrate SUB and the gate electrode GE are covered by the insulating film SP1 and the insulating film SW1.

Next, as shown in FIG. 19, the insulating film SW1 and the insulating film SP1 are provided with etch-back. Thereby, the side walls SW and the spacer film SP are formed. Here, in the example shown in FIG. 19, differently from the first embodiment (FIG. 8), the spacer film SP is configured to remain only under the side walls SW in a part formed along the surface of the substrate SUB.

Figure 20:
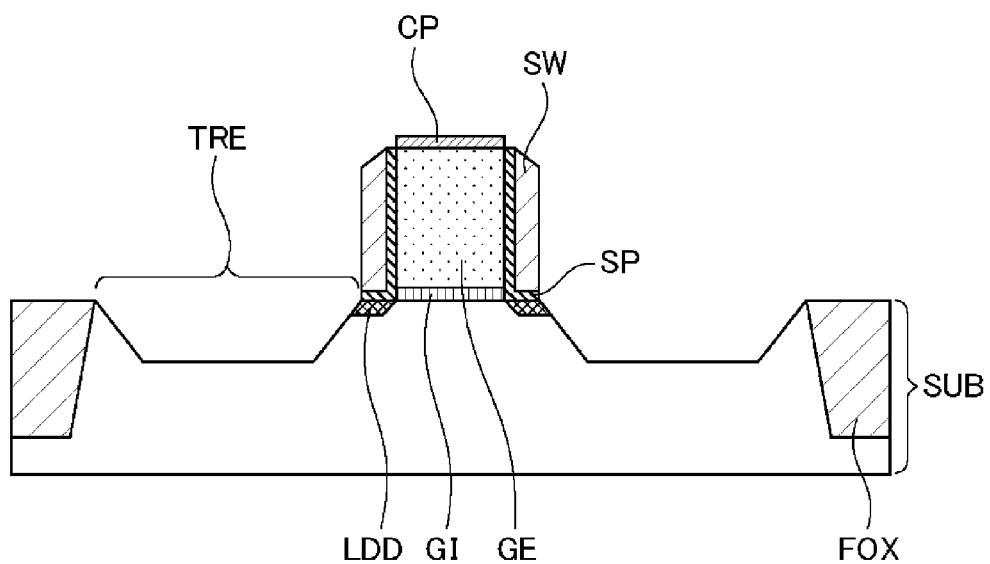
FIG. 20 is a cross-sectional view showing a manufacturing method of the semiconductor device shown in FIG. 13 and FIG. 14.

Next, as shown in FIG. 20, the surface of the substrate SUB is etched by RIE, for example, by the use of the gate electrode GE, the side walls SW, and the field oxide film FOX as masks. Thereby, the trenches TRE are formed in the surface of the substrate SUB. As will be described below in detail, the epitaxial layers EPI are formed in the trenches TRE.

Figure 21:
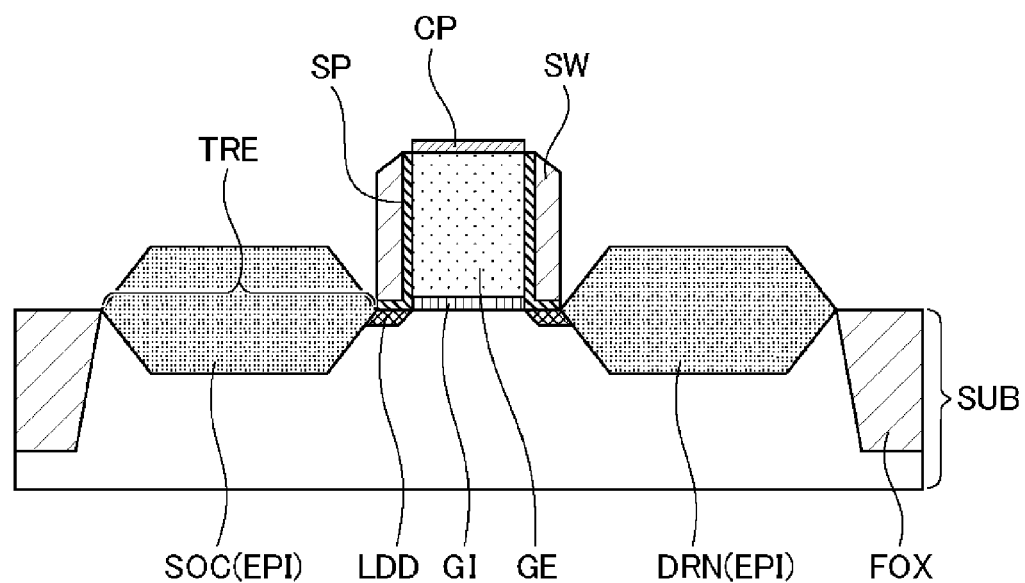
FIG. 21 is a cross-sectional view showing a manufacturing method of the semiconductor device shown in FIG. 13 and FIG. 14.

Next, as shown in FIG. 21, the epitaxial layers EPI (source SOC and drain DRN) are formed in the trenches TRE (FIG. 20) by epitaxial growth. In this case, impurities are doped in-situ in the epitaxial growth for causing the epitaxial layers EPI to function as the source SOC and the drain DRN. Note that the introduction of the impurities into the epitaxial layers EPI may be performed by ion implantation after the formation of the epitaxial layers EPI. Here, in the example shown in FIG. 21, the cap insulating film CP is formed over the upper face of the gate electrode GE. Accordingly, an epitaxial layer is not formed over the upper face of the gate electrode GE.

In the example shown in FIG. 21, each of the epitaxial layers EPI is grown until the surface layer protrudes from the opening of the corresponding trench TRE. In this case, the side faces of the above surface layer in each of the epitaxial layers EPI are sloped in respective directions in which the area of the epitaxial layer EPI decreases toward the top.

Figure 22:
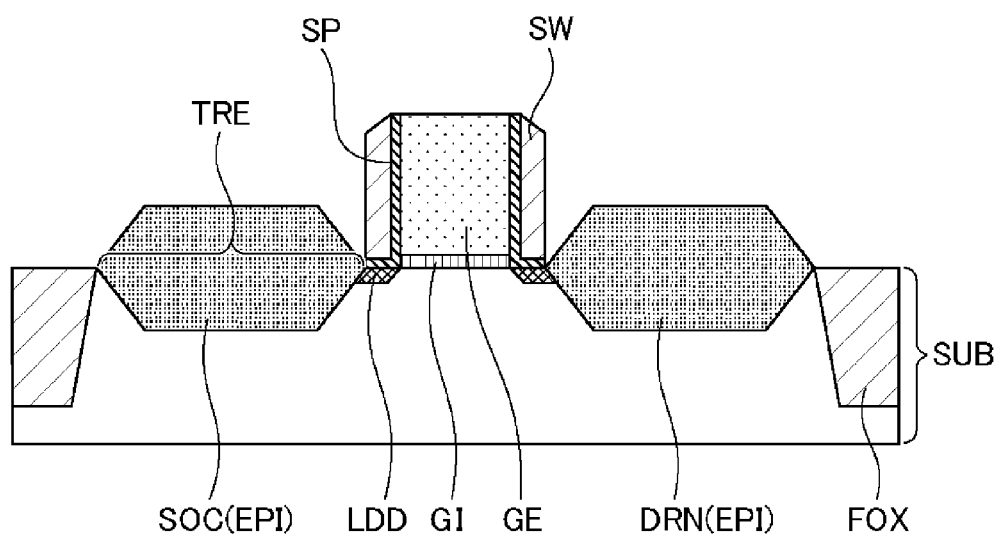
FIG. 22 is a cross-sectional view showing a manufacturing method of the semiconductor device shown in FIG. 13 and FIG. 14.

Next, as shown in FIG. 22, the cap insulating film CP (FIG. 21) is removed selectively by etching. Thereby, the upper face of the gate electrode GE is exposed.

Figure 23:
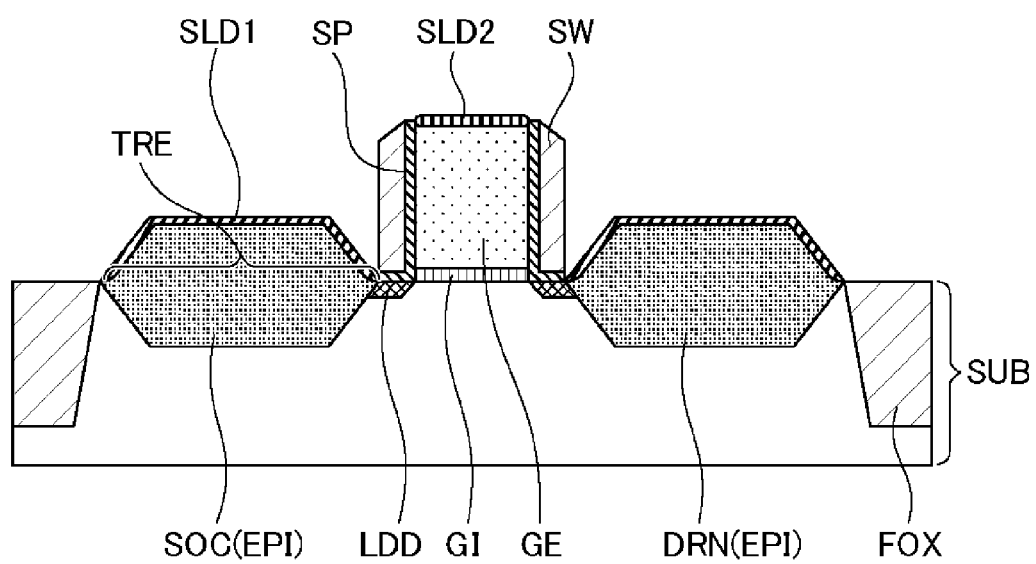
FIG. 23 is a cross-sectional view showing a manufacturing method of the semiconductor device shown in FIG. 13 and FIG. 14.

Next, as shown in FIG. 23, the silicide layers SLD1 are formed over the surface layers of the epitaxial layers EPI, and also a silicide layer SLD2 is formed over the surface layer of the gate electrode GE. Specifically, a metal film (e.g., nickel (Ni) film) is formed over the gate electrode GE, the side walls SW, and the substrate SUB. Then, the substrate SUB is provided with annealing. Thereby, the silicide layers SLD1 and SLD2 are formed as above.

Next, as shown in FIG. 24, an etching stop layer EST1 and the insulating film DL2 are formed in this order over the gate electrode GE, the side walls SW, and the epitaxial layers EPI. Subsequently, the surface layer of the insulating film DL2 is removed by CMP, for example. Thereby, the upper surface of the insulating film DL2 is made flat. Next, the contact CT is formed in the insulating film DL2. The contact CT passes through the insulating film DL2 and the etching stop layer EST1 and is connected to one of the epitaxial layers EPI.

Figure 25:
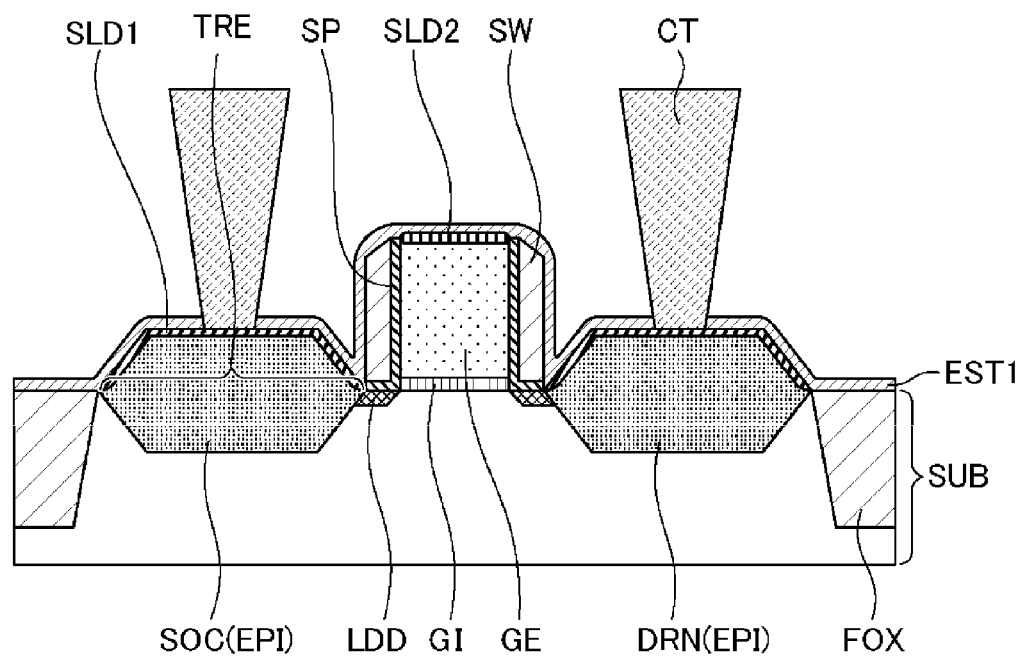
FIG. 25 is a cross-sectional view showing a manufacturing method of the semiconductor device shown in FIG. 13 and FIG. 14.

Next, as shown in FIG. 25, the insulating film DL2 is removed by etching. As in the first embodiment (FIG. 11), the etching is terminated by an etching stop layer (etching stop layer EST1) located under the insulating film DL2. Thereby, the insulating film DL2 is removed selectively.

Next, as shown in FIG. 26, the insulating layer DL1 is formed over the gate electrode GE, the side walls SW, the substrate SUB, and the contact CT. Thereby, the air gap AG is formed between one of the side walls SW and the contact CT.

In detail, in the example shown in FIG. 26, a space having a narrow width is formed in each positions between the epitaxial layers EPI and the side walls SW. Then, the space has a width increasing from the bottom to the top. Accordingly, when the insulating layer DL1 is embedded into this space, the insulating layer DL1 is embedded into this space so as to cause the upper face to have a concave part at the center part of this space. Then, as the insulating layer DL1 is further deposited over this space, the air gap AG is formed so as to succeed the above concave part. Thereby, in the example shown in FIG. 26, the air gap AG can be formed each having a large size compared with the first embodiment (FIG. 12).

Next, the surface layer of the insulating layer DL1 is removed by CMP, for example. In this case, the upper face of the insulating layer DL1 is removed until the upper face of the contact CT is exposed. Thereby, the upper face of the insulating layer DL1 is made flat. As above, the semiconductor device SD shown in FIG. 13 and FIG. 14 is manufactured.

As above, according to the present embodiment, the epitaxial layers EPI (source SOC and drain DRN) are embedded in the trenches TRE having the openings in the surface of the substrate SUB. Then, the surface layer in each of the epitaxial layers EPI protrudes from the opening in the corresponding trench TRE upward. Then, the space is formed in each of positions between the side faces of the above surface layer in each of the epitaxial layers EPI and the side walls SW, having a width decreasing from the top to the bottom. Thereby, in the present embodiment, it is possible to form the air gap AG in this space having a large size compared with the first embodiment.

Third Embodiment

Figure 27:
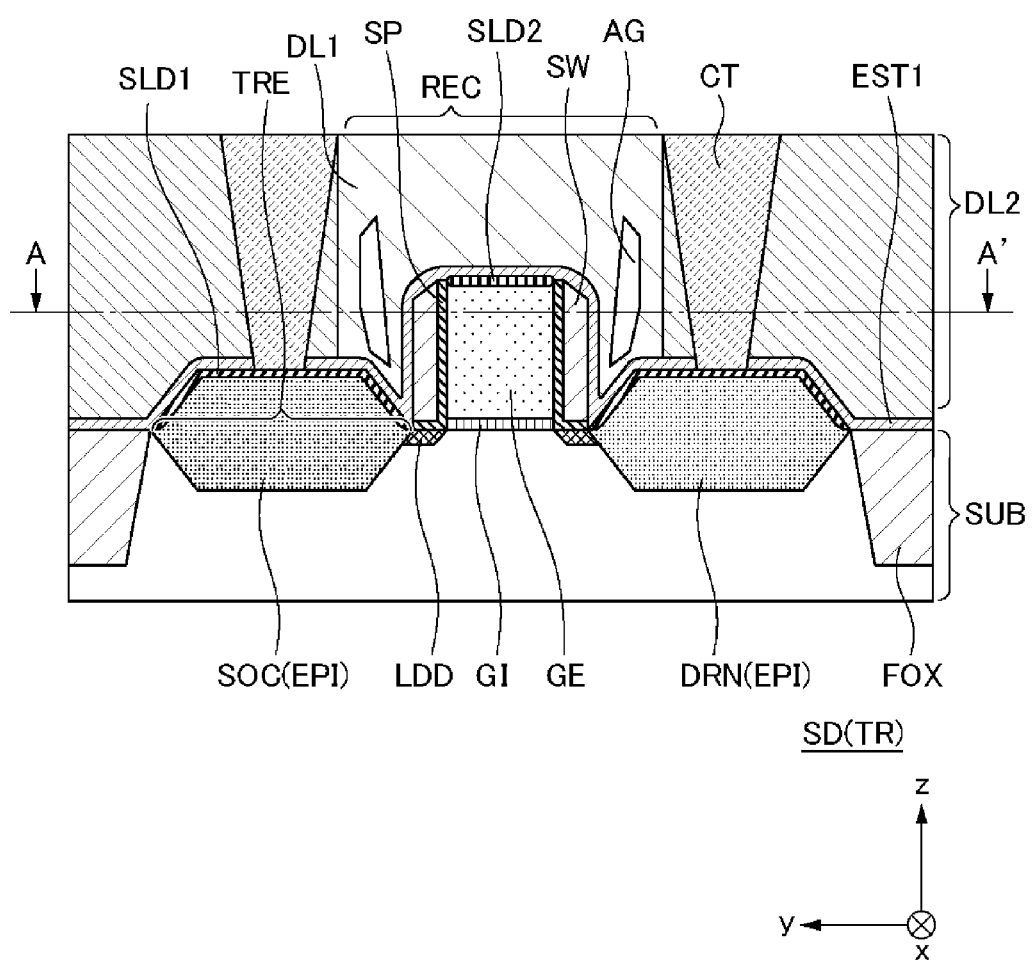
FIG. 27 is a cross-sectional view showing a configuration of a semiconductor device according to a third embodiment.
Figure 28:
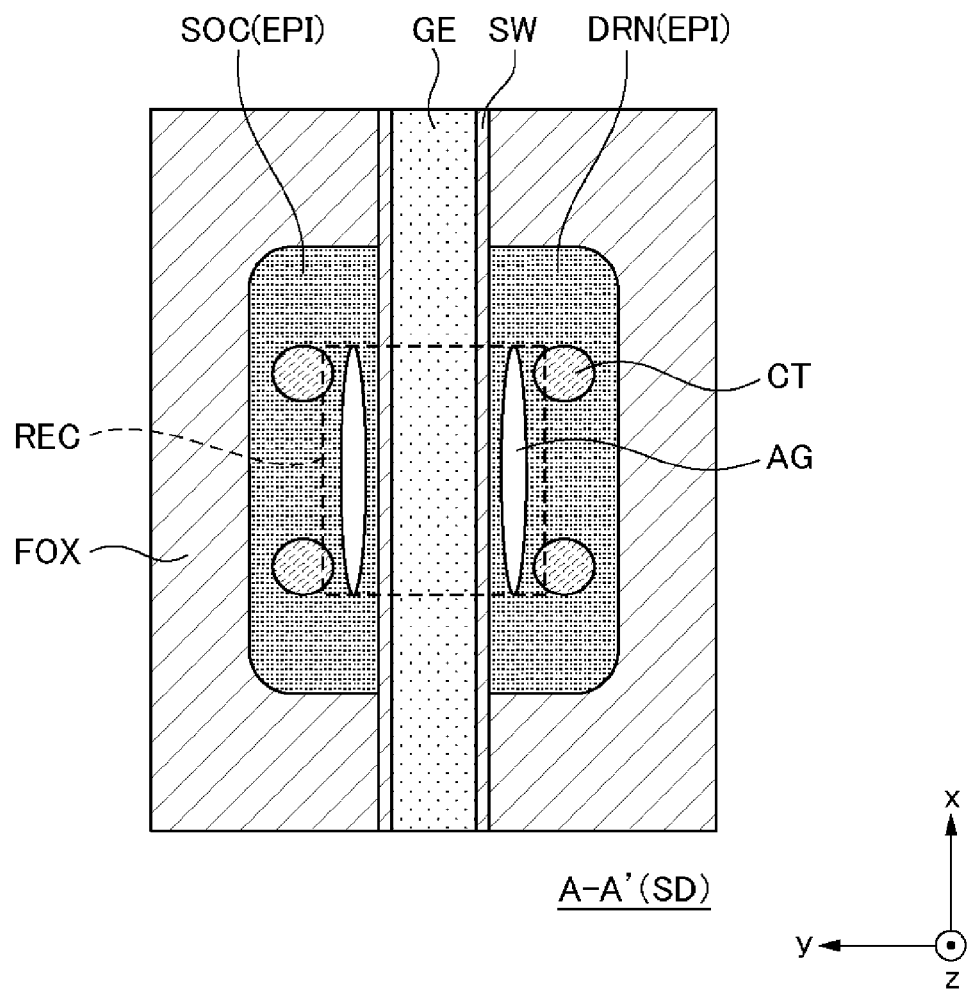
FIG. 28 is a cross-sectional view along A-A' line of FIG. 27.

FIG. 27 is a cross-sectional view showing a configuration of a semiconductor device SD according to a third embodiment, and corresponds to FIG. 13 of the second embodiment. FIG. 28 is across-sectional view along A-A' line of FIG. 27, and corresponds to FIG. 14 of the second embodiment. The semiconductor device SD according to the present embodiment has the same configuration as the semiconductor device SD according to the second embodiment except the following point.

As shown in FIG. 27, a gate electrode GE, side walls SW, epitaxial layers EPI, and a field oxide film FOX are covered by an etching stop layer EST1 as in the second embodiment. Then, an insulating layer DL2 (first insulating layer) is formed over the etching stop layer EST1. The insulating layer DL2 is a silicon oxide (SiO2) film, for example. Then contacts CT pass through the insulating layer DL2 and the etching stop layer EST1 and are connected to the respective epitaxial layers EPI.

A concave part REC is formed in the insulating layer DL2 having an opening in the surface of the insulating film DL2. The concave part REC is formed across the gate electrode GE and the side walls SW. Then, the concave part REC forms a space between the side wall SW on the source SOC side and the contact CT on the source SOC side, and also forms a space between the side wall SW on the drain DRN side and the contact CT on the drain DRN side. Here, in the example shown in FIG. 27, the insulating layer DL2 is almost removed in a region overlapping the concave part REC in a plan view. Accordingly, the etching stop layer EST1 is located at the bottom face of the concave part REC.

An insulating layer DL1 (second insulating layer) is embedded in the concave part REC. The insulating layer DL1 is formed of a material different from that of the insulating layer DL2, and is formed of a material having a dielectric constant lower than that of the insulating layer DL2, for example. Specifically, the insulating layer DL1 is formed of low-k material (e.g., SiCOH), for example. In the example shown in FIG. 27, the insulating layer DL1 fills the concave part REC across the gate electrode GE and the side walls SW. Here, the upper surface of the insulating layer DL1 is connected to the upper face of the insulating layer DL2 without a step (e.g., flush with the insulating layer DL2).

An air gap AG is located between the side wall SW on the source SOC side and the inner side face of the concave part REC on the source SOC side. Similarly, an air gap AG is located also between the side wall SW on the drain DRN side and the inner side face of the concave part REC on the drain DRN side. These two air gaps AG are separated from each other via the gate electrode GE and the side walls SW.

Each of the air gaps AG is formed in the insulating layer DL1, and is a hollow inside the insulating layer DL1. In other words, any inner wall part in each of the air gaps AG is covered by the insulating layer DL1. In this case, the air gap AG faces the inner side face of the concave part REC on the contact CT side at the side face on the contact CT side via the insulating layer DL1. Further, the air gap AG faces the inner side face of the concave part REC on the side wall SW side at the side face on the side wall SW side via the insulating layer DL1. Further, the air gap AG faces the substrate SUB at the side face on the substrate SUB side via the insulating layer DL1.

As shown in FIG. 28, the concave part REC extends in the first direction (x-axis direction in FIG. 28) in a plan view. Then, the extension length in each of the air gaps AG in the first direction (x-axis direction in FIG. 28) approximately coincides with the extension length of the concave part REC in the first direction. In other words, as the extension length of the concave part REC in the first direction becomes longer, the extension length in each of the air gaps AG in the first direction also becomes longer. Then, in the example shown in FIG. 28, the concave part REC extends in the first direction.

In the plan view, each of the air gaps AG is formed continuously from a region sandwiched between one contact CT and one of the side walls SW in the second direction (y-axis direction in FIG. 28) to a region sandwiched between another contact CT and the side wall SW in the second direction. In the example shown in FIG. 28, each of the air gaps AG is formed from one to another one of two contacts CT neighboring each other when viewed in the second direction. Note that the extension length of the air gap AG is not limited to the example shown in FIG. 28. For example, each of the air gaps AG may be formed across three or more contacts CT, when viewed in the second direction.

Figure 29:
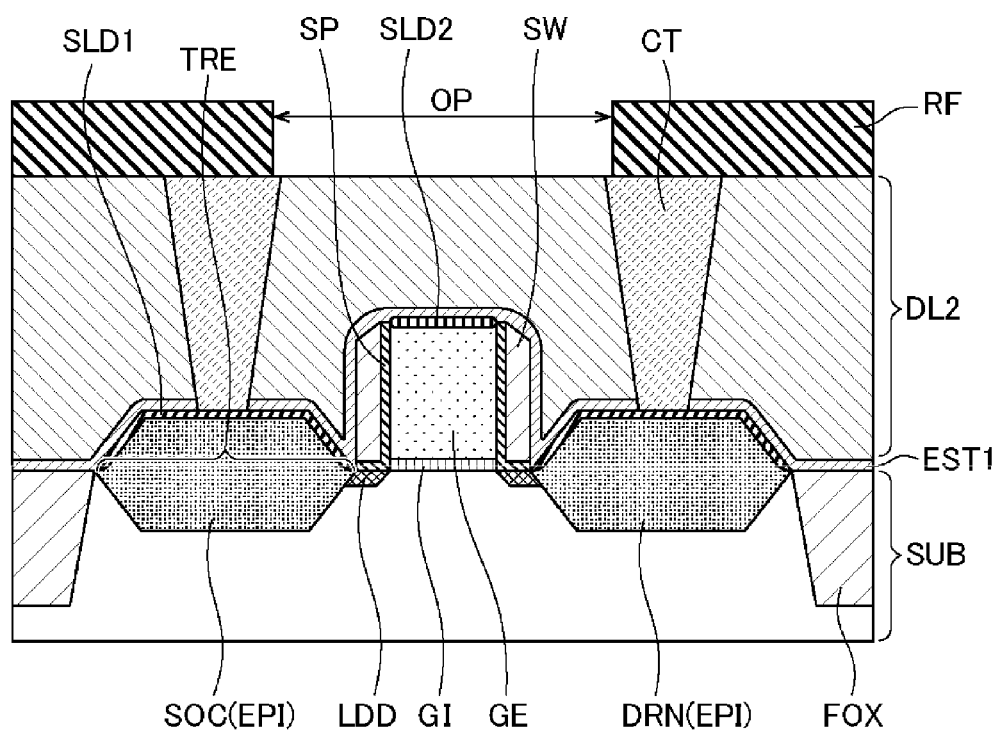
FIG. 29 is a cross-sectional view showing a manufacturing method of the semiconductor device shown in FIG. 27 and FIG. 28.
Figure 31:
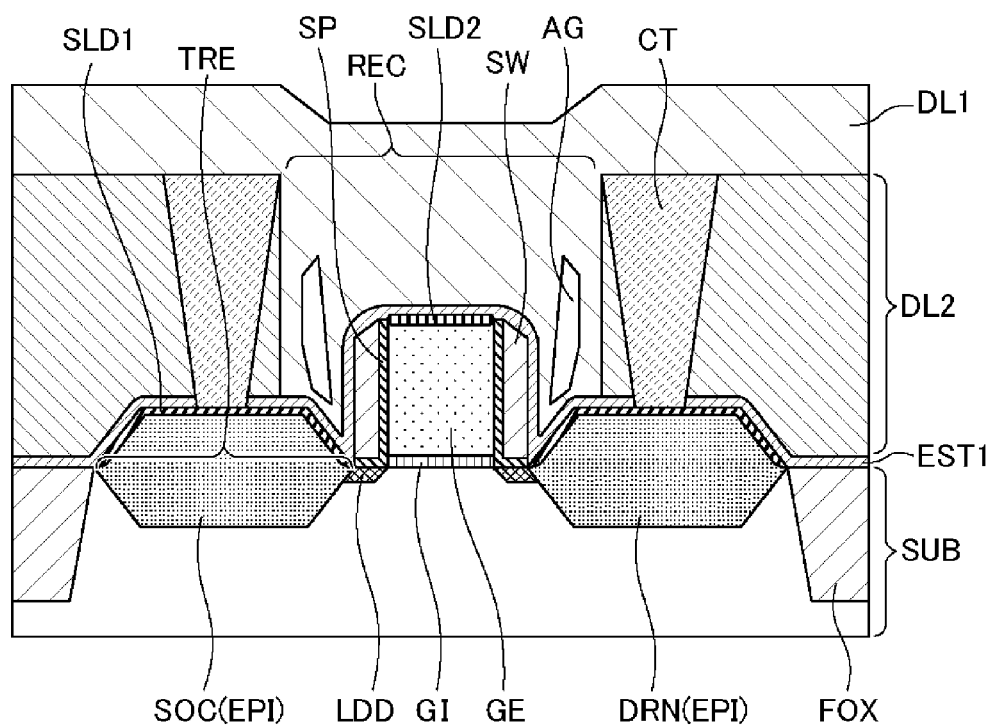
FIG. 31 is a cross-sectional view showing a manufacturing method of the semiconductor device shown in FIG. 27 and FIG. 28.

FIG. 29 to FIG. 31 are cross-sectional views showing a manufacturing method of the semiconductor device SD shown in FIG. 27 and FIG. 28. First, the processes shown in FIG. 15 to FIG. 24 are carried out as in the second embodiment.

Next, as shown in FIG. 29, a resist film RF is formed over the insulating layer DL2. The resist pattern of the resist film RF includes an opening OP. The opening OP includes a region where the concave part REC is formed inside in a process to be described below, in a plan view.

Next, as shown in FIG. 30, the insulating film DL2 is provided with anisotropic etching by the use of the resist film RF as a mask. Thereby, the concave part REC is formed in the insulating layer DL2. Here, in the example shown in FIG. 30, the width of the opening OP in the resist film RF along the second direction (y-axis direction in FIG. 30) is wider than a spacing between the upper end of the contact CT on the source SOC side and the upper end of the contact CT on the drain DRN side. Thereby, in a region sandwiched by the contact CT on the source SOC side and the contact CT on the drain DRN side, the side face of the concave part REC is formed self-aligned with the upper end of the contact CT on the source SOC side and the upper end of the contact CT on the drain DRN side.

Next, as shown in FIG. 31, the insulating layer DL1 is formed over the concave part REC and the insulating layer DL2 by CVD, for example. Thereby, the insulating layer DL1 is embedded into the concave part REC. Further, in this case, one of the air gaps AG is formed between the side wall SW on the source SOC side and the inner side face of the concave part REC on the source SOC side, and also the other one of the air gaps AG is formed between the side wall SW on the drain DRN side and the inner side face of the concave part REC on the drain DRN side.

In detail, in the example shown in FIG. 31, a space is formed between the side wall SW on the source SOC side and the inner side face of the concave part REC on the source SOC side. Then, the aspect ratio of the height of this space with respect to the width of this space is configured to be high as in the first embodiment and the second embodiment. Accordingly, it is difficult to embed the insulating layer DL1 into the above space. Resultantly, the air gaps AG are formed as in the first embodiment and the second embodiment.

Next, the surface layer of the insulating layer DL1 is removed by CMP, for example. In this case, the upper face of the insulating layer DL1 is removed until the upper face of the insulating layer DL1 is connected to the upper face of the insulating layer DL2 without a step. As above, the semiconductor device SD shown in FIG. 27 and FIG. 28 is manufactured.

As above, according to the present embodiment, the insulating layer DL2 is located above the substrate SUB. Then, the concave part REC is formed in the insulating layer DL2 between the contact CT on the source SOC side and the contact CT on the drain DRN side. Then, the insulating layer DL1 is embedded in the concave part REC. Thereby, one of the air gaps AG is formed between the side wall SW on the source SOC side and the inner side face of the concave part REC on the source SOC side, and also the other one of the air gaps AG is formed between the side wall SW on the drain DRN side and the inner side face of the concave part REC on the drain DRN side.

Then, according to the present embodiment, the length of the air gap AG in the first direction (extension direction of the gate electrode GE) approximately coincides with the length of the concave part REC in the first direction. Accordingly, by increasing the length of the concave part REC in the first direction, it is possible to increase the length of the air gap AG in the first direction. Thereby, in the present embodiment, it is possible to form the air gap AG having a size larger than that of the air gap AG according to the first embodiment and the second embodiment.

Note that, while the epitaxial layers EPI is formed as a source SOC and a drain DRN in the present embodiment, the configuration of the source SOC and the drain DRN is not limited to this configuration. For example, the source SOC and the drain DRN may be formed by diffusion layers DIF as in the first embodiment (FIG. 2).

Figure 32:
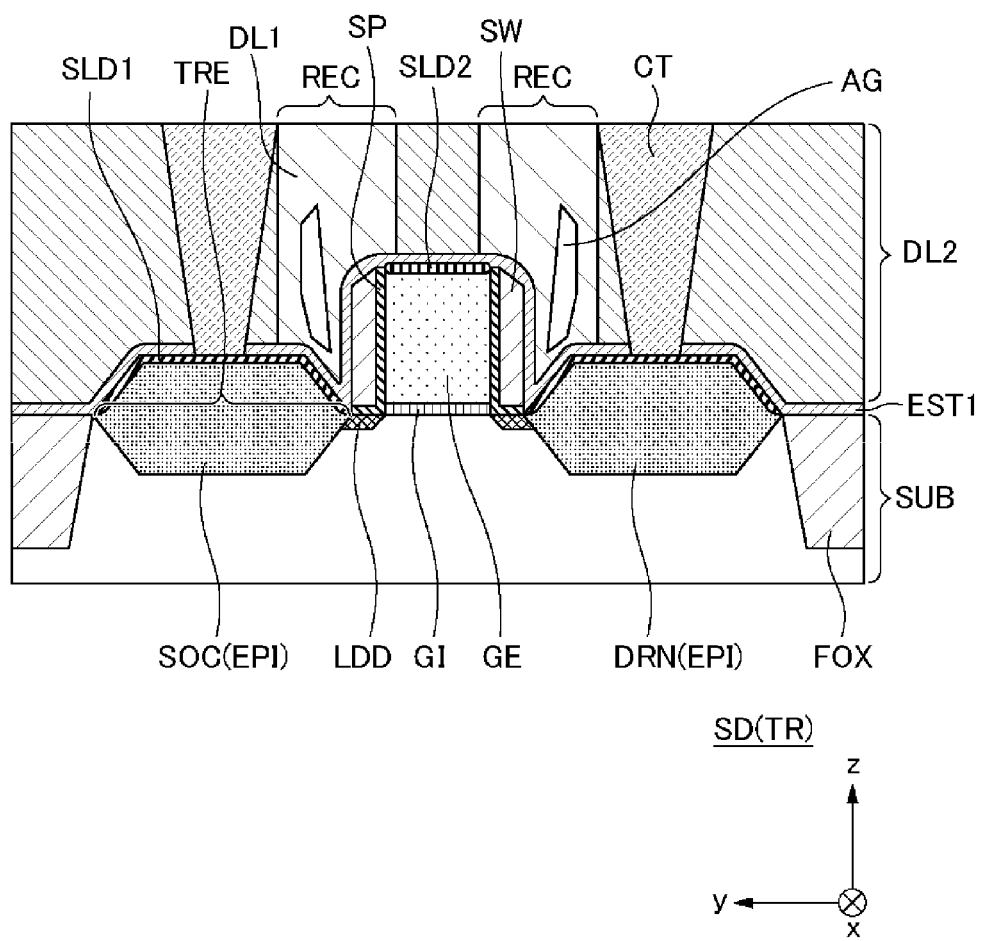
FIG. 32 is a cross-sectional view showing a variation example of FIG. 27.

FIG. 32 is a cross-sectional view showing a variation example of FIG. 27. As shown in FIG. 32, the concave part REC may be divided into a concave part REC on the source SOC side and a concave part REC on the drain DRN side by the insulating layer DL2 over the gate electrode GE. Further, in the example shown in FIG. 32, the concave part REC on the source SOC side is configured to include at least a part of the side wall SW on the source SOC side in a plan view. Similarly, the concave part REC on the drain DRN side is configured to include at least a part of the side wall SW on the drain DRN side in the plan view. Also in the variation example, spaces are formed by the concave parts REC between the side walls SW and the contacts CT. Accordingly, it is possible to form the air gaps AG as in the third embodiment.

Figure 33:
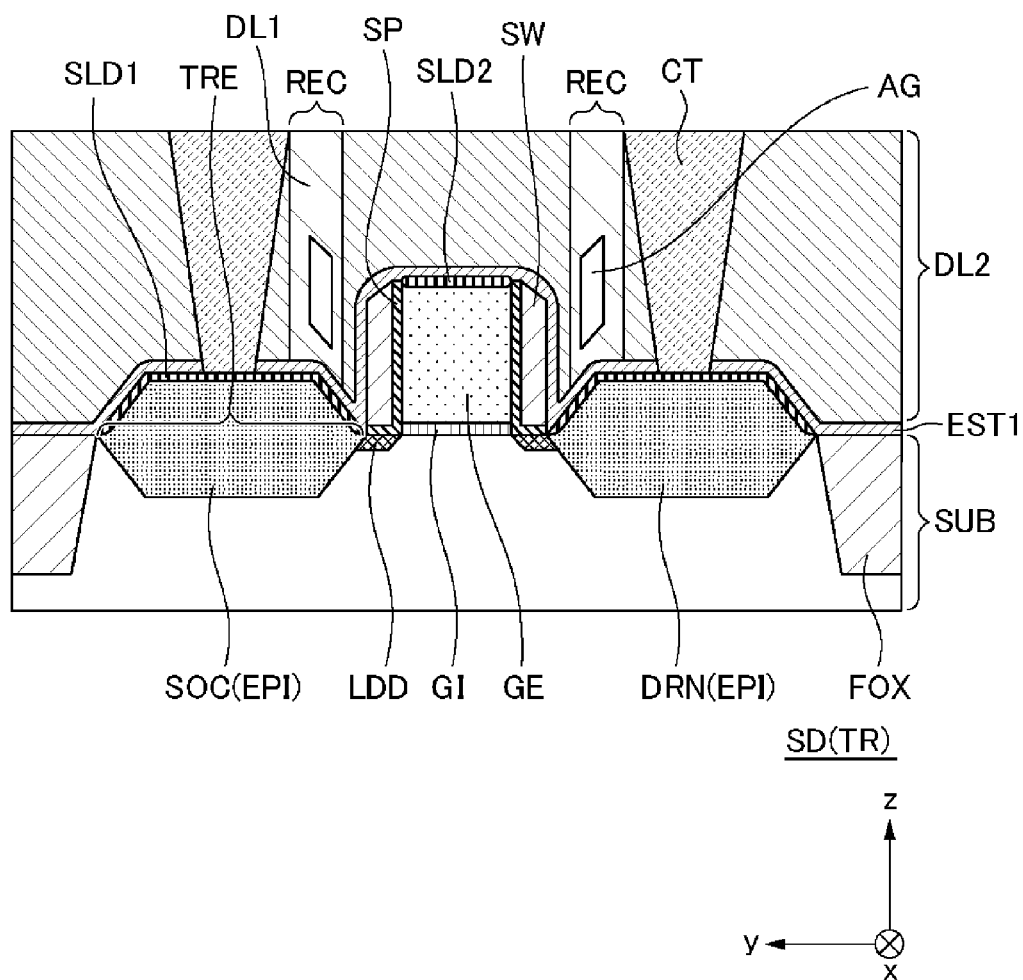
FIG. 33 is a cross-sectional view showing a variation example of FIG. 32.

FIG. 33 is a cross-sectional view showing a variation example of FIG. 32. As shown in FIG. 33, the side face on the gate electrode GE side in the concave part REC on the source SOC side may be located on the source SOC side from the side wall SW on the source SOC side. Similarly, the side face on the gate electrode GE side in the concave part REC on the drain DRN side may be located on the drain DRN side from the side wall SW on the drain DRN side. Also in the present variation example, it is possible to form the air gaps AG as in the variation example shown in FIG. 32.

While the invention achieved by the present inventors has been explained specifically by the use of the embodiments as above, obviously the present invention is not limited to the above embodiments, and can be modified variously in the range without departing from the gist of the invention.

What is claimed is:

1. A semiconductor device, comprising:
   a substrate;
   a gate electrode formed over the substrate;
   side walls formed over side faces of the gate electrode;
   impurity regions which are formed in the substrate and become a source and a drain;
   a first insulating layer and a second insulating layer formed of a material having a dielectric constant lower than that of the first insulating layer, the first insulating layer and the second insulating layer collectively covering the gate electrode, the side walls, and the impurity regions;
   a contact which passes through the first insulating layer and is connected to one of the impurity regions, wherein the second insulating layer is embedded between one of the sidewalls and the contact; and
   an air gap which is formed in the second insulating layer and is located between one of the side walls and the contact, and which faces the contact at the side face on the contact side via the second insulating layer.

2. The semiconductor device according to claim 1,
   wherein the gate electrode and the side walls extend in a first direction in a plan view,
   the contact is arranged in plurality along the first direction in the plan view, and
   in the plan view, the air gap is formed continuously from a region sandwiched by one of the contacts and one of the side walls in a second direction perpendicular to the first direction to a region sandwiched by another one of the contacts and the one of side walls in the second direction.

3. The semiconductor device according to claim 1,
   wherein each of the impurity regions is a semiconductor layer embedded in a trench having an opening in a surface of the substrate,
   a surface layer of the semiconductor layer protrudes from the opening of the trench to a side of an upper face of the insulating layer, and
   a side face of the surface layer on a side of one of the side walls is more apart from the one of the side walls toward a side of an upper face of the surface layer.

4. The semiconductor device according to claim 1,
wherein the semiconductor device further includes a spacer film formed along the side faces of the gate electrode and the surface of the substrate.

5. A semiconductor device, comprising:

a substrate;

a gate electrode formed over the substrate;

side walls formed over side faces of the gate electrode;

impurity regions which are formed in the substrate and become a source and a drain;

a first insulating layer covering the gate electrode, the side walls, and the impurity regions;

a contact which passes through the first insulating layer and is connected to one of the impurity regions;

a concave part which has an opening in a surface of the first insulating layer and is located between one of the side walls and the contact;

a second insulating layer formed of a material having a dielectric constant lower than that of the first insulating layer and embedded in the concave part; and an air gap which is formed in the second insulating layer and is located between one of the side walls and the contact, and faces the inner side face of the concave part on the contact side at the side face on the contact side via the second insulating layer.

6. The semiconductor device according to claim 5,
wherein the gate electrode, the side walls, and the concave part extend in a first direction in a plan view, the contact is arranged in plurality along the first direction in the plan view, and in the plan view, the air gap is formed continuously from a region sandwiched by one of the contacts and one of the side walls in a second direction perpendicular to the first direction to a region sandwiched by another one of the contacts and the one of side walls in the second direction.

7. The semiconductor device according to claim 5,
wherein the concave part is formed across the gate electrode and the side walls between the drain and the source, and in a plan view, the air gap is located at a position between the source and the gate electrode and a position between the drain and the gate electrode.

8. The semiconductor device according to claim 5,
wherein each of the impurity regions is a semiconductor layer embedded in a trench having an opening in a surface of the substrate, a surface layer of the semiconductor layer protrudes from the opening of the trench to sides of upper faces of the first insulating layer and the second insulating layer, and a side face of the surface layer on a side of one of the side walls is more apart from the one of the side walls toward a side of an upper face of the surface layer.

9. The semiconductor device according to claim 1,
wherein the air gap is formed in the second insulating layer and the air gap is located between the contact and a first sidewall, among the sidewalls, that is closest to the side face of the contact.

10. The semiconductor device according to claim 5,
wherein the air gap is located between the contact and a first sidewall, among the sidewalls, that is closest to the side face of the contact.

11. The semiconductor device according to claim 5,
wherein the opening extends throughout the entirety of the first insulating layer in the vertical direction.

\* \* \* \* \*